(12) United States Patent
Ito et al.

(10) Patent No.: US 10,581,405 B2
(45) Date of Patent: Mar. 3, 2020

(54) MULTIPLEXER

(71) Applicant: TAIYO YUDEN CO., LTD., Tokyo (JP)

(72) Inventors: Masato Ito, Tokyo (JP); Yuki Endo, Tokyo (JP); Ryo Miyamoto, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 42 days.

(21) Appl. No.: 15/646,431

(22) Filed: Jul. 11, 2017

(65) Prior Publication Data
US 2018/0041194 A1 Feb. 8, 2018

(30) Foreign Application Priority Data

Aug. 4, 2016 (JP) .................. 2016-153999

(51) Int. Cl.
| | |
|---|---|
| H03H 9/64 | (2006.01) |
| H03H 9/70 | (2006.01) |
| H03H 9/72 | (2006.01) |
| H03H 9/54 | (2006.01) |
| H03H 9/56 | (2006.01) |
| H03H 9/25 | (2006.01) |

(52) U.S. Cl.
CPC ............ *H03H 9/6496* (2013.01); *H03H 9/25* (2013.01); *H03H 9/542* (2013.01); *H03H 9/568* (2013.01); *H03H 9/6483* (2013.01); *H03H 9/706* (2013.01); *H03H 9/725* (2013.01)

(58) Field of Classification Search
CPC ...... H03H 7/0153; H03H 9/542; H03H 9/605; H03H 9/6403; H03H 9/6483; H03H 2210/025

USPC .......................................... 333/174
See application file for complete search history.

(56) References Cited

U.S. PATENT DOCUMENTS

| | | | |
|---|---|---|---|
| 2007/0024392 A1* | 2/2007 | Inoue | H03H 9/0576 333/133 |
| 2008/0024243 A1 | 1/2008 | Iwaki et al. | |
| 2008/0055021 A1 | 3/2008 | Ueda et al. | |

(Continued)

FOREIGN PATENT DOCUMENTS

| | | |
|---|---|---|
| JP | 9-284093 A | 10/1997 |
| JP | 10-56304 A | 2/1998 |

(Continued)

OTHER PUBLICATIONS

PCS BAND2, Phonescoop.com, Apr. 2003.*

(Continued)

*Primary Examiner* — Benny T Lee
*Assistant Examiner* — Hafizur Rahman
(74) *Attorney, Agent, or Firm* — Chen Yoshimura LLP

(57) ABSTRACT

A multiplexer includes: a first filter that includes a piezoelectric thin film resonator and is connected between a common terminal and a first terminal, the piezoelectric thin film resonator being located on a substrate; a second filter that includes an acoustic wave resonator and is connected between the common terminal and a second terminal, the acoustic wave resonator including an IDT located on a piezoelectric substrate; and a capacitor that includes a pair of electrodes facing each other in a planar direction and is coupled to the first filter, the pair of electrodes being located on the piezoelectric substrate.

10 Claims, 25 Drawing Sheets

(56) References Cited

U.S. PATENT DOCUMENTS

| | | | |
|---|---|---|---|
| 2008/0284540 A1 | 11/2008 | Nishihara et al. | |
| 2010/0109801 A1 | 5/2010 | Inoue et al. | |
| 2011/0187478 A1 | 8/2011 | Link et al. | |
| 2011/0199168 A1 | 8/2011 | Kadota | |
| 2011/0210805 A1 | 9/2011 | Link et al. | |
| 2014/0113580 A1 | 4/2014 | Yamazaki | |
| 2014/0218128 A1* | 8/2014 | Fujita | H03H 7/461 333/133 |
| 2014/0341090 A1 | 11/2014 | Kawachi et al. | |
| 2015/0236840 A1* | 8/2015 | Link | H04L 5/14 370/281 |
| 2015/0295559 A1* | 10/2015 | White | H03H 9/706 455/78 |
| 2017/0359051 A1 | 12/2017 | Urata | |

FOREIGN PATENT DOCUMENTS

| | | |
|---|---|---|
| JP | 2005-109573 A | 4/2005 |
| JP | 2005-136588 A | 5/2005 |
| JP | 2007-336479 A | 12/2007 |
| JP | 2008-085989 A | 4/2008 |
| JP | 2008-271230 A | 11/2008 |
| JP | 2010-109894 A | 5/2010 |
| JP | 2012-501564 A | 1/2012 |
| JP | 2013-066250 A | 4/2013 |
| JP | 2015-154434 A | 8/2015 |
| WO | 2012/176508 A1 | 12/2012 |
| WO | 2013/118237 A1 | 8/2013 |
| WO | 2016/104598 A1 | 6/2016 |

OTHER PUBLICATIONS

Aigner, R. "SAW and BAW Technologies for RF Filter Applications: A Review of the Relative Strengths and Weaknesses", 2008 IEEE International Ultrasonics Symposium Proceedings (Year: 2008).*
Japanese Office Action dated Jan. 29, 2019, in a counterpart Japanese patent application No. 2016-153999. (A machine translation (not reviewed for accuracy) attached.).

* cited by examiner

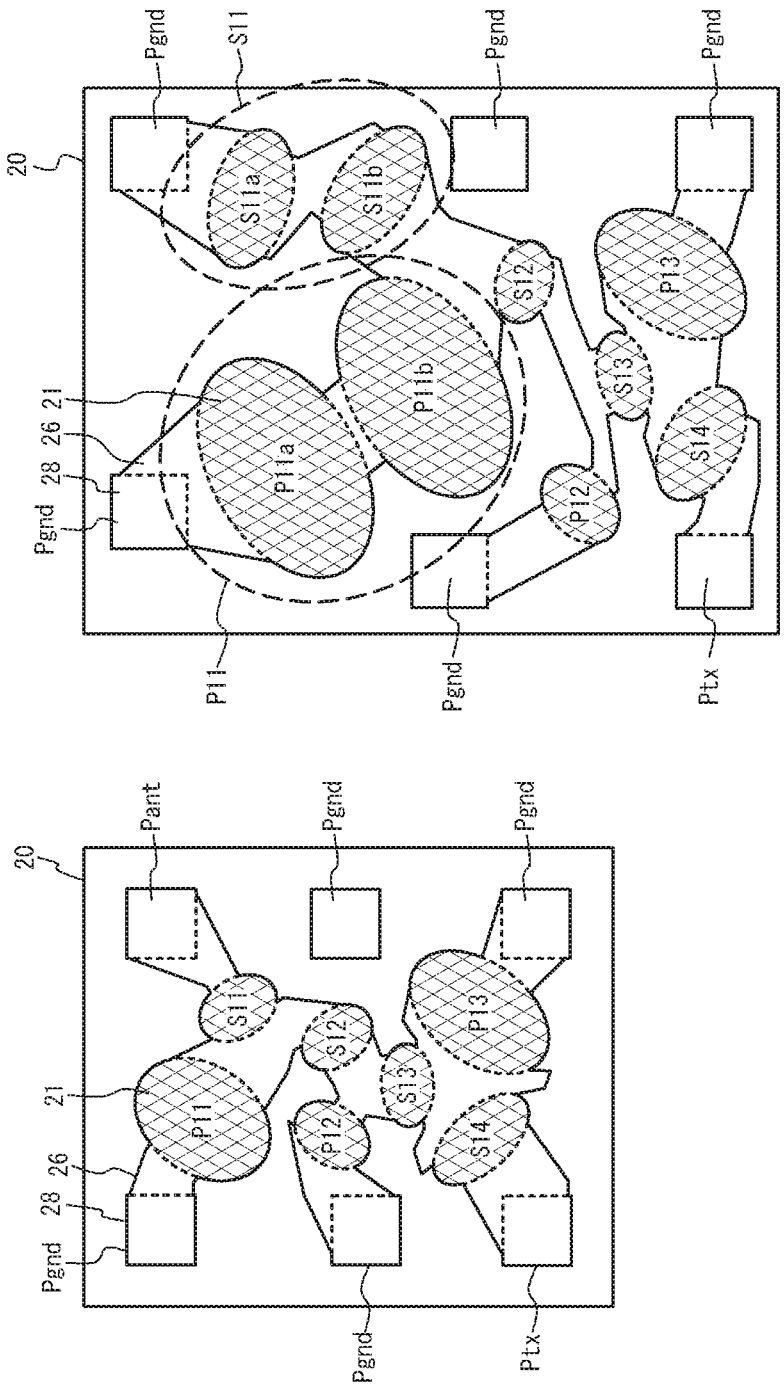

MULTIPLEXER

CROSS-REFERENCE TO RELATED APPLICATION

This application is based upon and claims the benefit of priority of the prior Japanese Patent Application No. 2016-153999, filed on Aug. 4, 2016, the entire contents of which are incorporated herein by reference.

FIELD

A certain aspect of the present invention relates to a multiplexer.

BACKGROUND

Rapid diffusion of wireless devices typified by mobile communications has increased the demand for small and light acoustic wave filters and multiplexers including such acoustic wave filters. Piezoelectric thin film resonators such as surface Acoustic Wave (SAW) resonators, Film Bulk Acoustic Resonators (FBARs), and Solidly Mounted Resonators (SMRs) are widely used as the acoustic wave resonator.

It has been known to couple a capacitor to a duplexer or a filter and couple a band suppression filter such as a notch filter to a duplexer or a filter as disclosed in, for example, Japanese Patent Application Publication Nos. 10-56304 (Patent Document 1), 9-284093 (Patent Document 2), 2012-501564 (Patent Document 3), 2015-154434 (Patent Document 4), 2010-109894 (Patent Document 5), 2005-109573 (Patent Document 6), and 2005-136588 (Patent Document 7), and International Publication No. 2012/176508 (Patent Document 8). It has been known that the piezoelectric thin film resonator easily generates second harmonics as disclosed in Japanese Patent Application Publication No. 2008-85989 (Patent Document 9).

When a capacitor is coupled to a filter including a piezoelectric thin film resonator, use of a chip capacitor increases the filter size. In addition, the chip capacitor has a large tolerance. Thus the variation in capacitance is large. When a capacitor is located on a substrate including a piezoelectric thin film resonator formed thereon, unnecessary spurious such as second harmonics occurs.

SUMMARY OF THE INVENTION

According to an aspect of the present invention, there is provided a multiplexer including: a first filter that includes a piezoelectric thin film resonator and is connected between a common terminal and a first terminal, the piezoelectric thin film resonator being located on a substrate; a second filter that includes an acoustic wave resonator and is connected between the common terminal and a second terminal, the acoustic wave resonator including an IDT located on a piezoelectric substrate; and a capacitor that includes a pair of electrodes facing each other in a planar direction and is coupled to the first filter, the pair of electrodes being located on the piezoelectric substrate.

BRIEF DESCRIPTION OF THE DRAWINGS

FIG. 4A and FIG. 4B are plan views of a transmit filter before and after piezoelectric thin film resonators are divided, respectively;

DETAILED DESCRIPTION

Figure 1A:
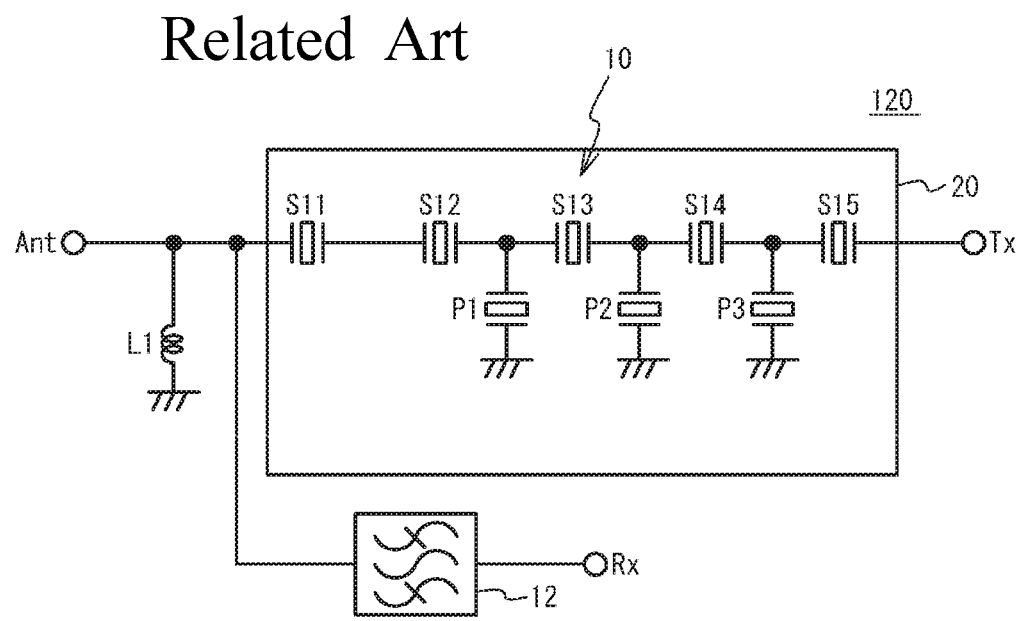
FIG. 1A is a circuit diagram of a duplexer in accordance with a first comparative example.
Figure 1B:
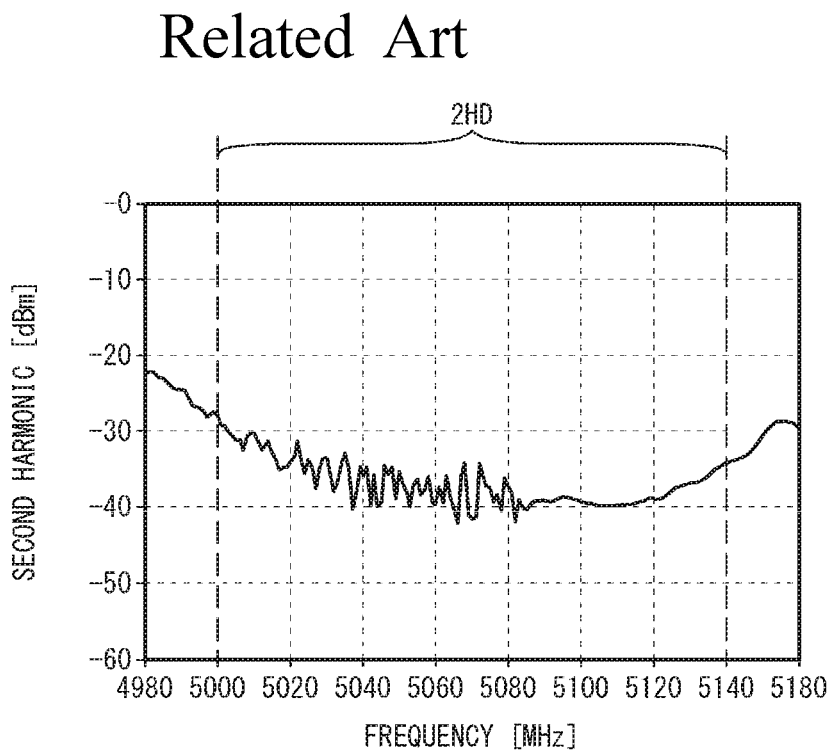
FIG. 1B illustrates measurement results of a second harmonic in the first comparative example.

A description will be given of a notch circuit that suppresses second harmonics as an example that couples a capacitor to a multiplexer. FIG. 1A is a circuit diagram of a duplexer in accordance with a first comparative example, and FIG. 1B illustrates measurement results of a second harmonic in the first comparative example.

As illustrated in FIG. 1A, a duplexer 120 includes a transmit filter 10 and a receive filter 12. The transmit filter 10 is connected between a common terminal Ant and a transmit terminal Tx. The receive filter 12 is connected between the common terminal Ant and a receive terminal Rx. The transmit filter 10 is a ladder-type filter, and includes series resonators S11 through S15 and parallel resonators P11 through P13. The series resonators S11 through S15 and the parallel resonators P11 through P13 are piezoelectric thin film resonators formed on a substrate 20. The receive filter 12 includes a surface acoustic wave resonator. An inductor L1 as a matching circuit is connected between the common terminal Ant and a ground. The transmit filter 10 transmits signals in the transmit band to the common terminal Ant among high-frequency signals input to the transmit terminal Tx, and suppresses signals with other frequencies. The receive filter 12 transmits signals in the receive band to the receive terminal Rx among high-frequency signals input to the common terminal Ant, and suppresses signals with other frequencies.

The duplexer 120 supports Band7 (transmit band: 2500 MHz to 2570 MHz, receive band: 2620 MHz to 2690 MHz) in Long Term Evolution (LTE) standard (E-UTRA Operating Band). When a signal with large electric power is input from the transmit terminal Tx, second harmonics are generated in the piezoelectric thin film resonators in the transmit filter 10, and are output from the common terminal Ant. The second harmonics generated in the piezoelectric thin film resonators closer to the transmit terminal Tx are suppressed by subsequent piezoelectric thin film resonators, but the second harmonics generated in the series resonator S11 and the parallel resonator P11, which are located closest to the common terminal Ant, are output without being suppressed.

Third Generation Partnership Project (3GPP) standard defines that unnecessary radio waves should be −30 dBm or less at frequencies from 1 GHz to 12.75 GHz. The magnitude of the second harmonic is required to satisfy this standard. Signals with a frequency of 2500 MHz to 2570 MHz and an electric power of 28 dBm were input to the transmit terminal Tx to measure the second harmonic output from the common terminal Ant.

As illustrated in FIG. 1B, the range from 5000 MHz to 5140 MHz is a frequency band 2 HD that is twice the transmit band. The second harmonic is required to be −30 dBm or less within the frequency band 2 HD. However, the second harmonic is greater than −30 dBm around 5000 MHz.

Figure 2A:
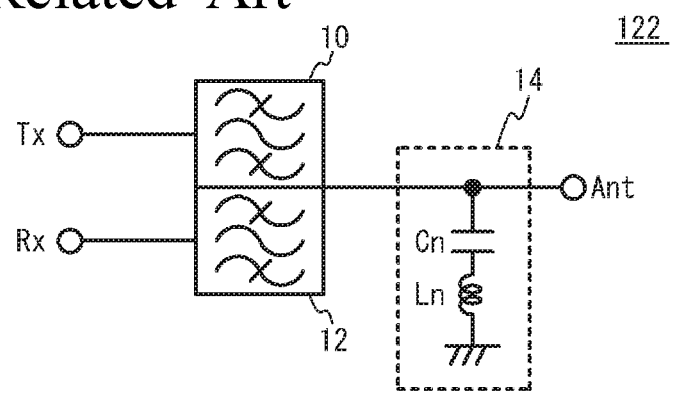
FIG. 2A is a circuit diagram of a duplexer in accordance with a second comparative example.
Figure 2B:
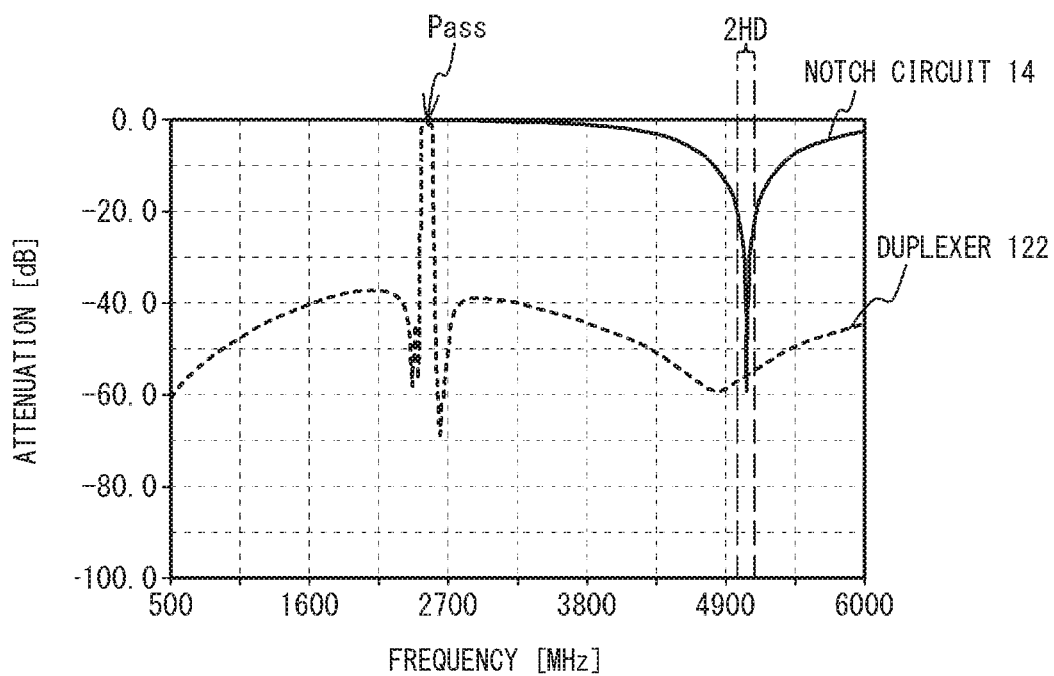
FIG. 2B illustrates transmission characteristics in the second comparative example.

Connecting a notch circuit to the common terminal Ant may be considered as a countermeasure. FIG. 2A is a circuit diagram of a duplexer in accordance with a second comparative example, and FIG. 2B illustrates transmission characteristics in the second comparative example. As illustrated in FIG. 2A, a notch circuit 14 is connected between the common terminal Ant and the transmit filter 10 and the receive filter 12. The notch circuit 14 includes a capacitor Cn and an inductor Ln connected in series between the common terminal Ant and a ground. The transmit filter 10 and the receive filter 12 are filters for Band7. The suppression band of the notch circuit 14 is located around the resonant frequency of the series resonant circuit including the capacitor Cn and the inductor Ln. When the capacitor Cn has a capacitance of 0.4 pF and the inductor Ln has an inductance of 2.5 nH, the notch circuit 14 has a suppression band within the frequency band 2 HD.

FIG. 2B illustrates simulation results of the transmission characteristic (solid line) of the notch circuit 14 and the transmission characteristic (dashed line) of a duplexer 122. The transmission characteristic of the notch circuit 14 is the transmission characteristic between the common terminal Ant and the transmit filter 10. The notch circuit 14 has a suppression band within the frequency band 2 HD. The duplexer 122 has an attenuation pole near the frequency band 2 HD. The use of the notch circuit 14 inhibits the second harmonic generated in the transmit filter 10 from being output from the common terminal Ant.

For example, it may be considered to apply Patent Document 1 to the second comparative example and use chip components for the capacitor Cn and the inductor Ln. However, the chip component has a large tolerance. For example, the tolerance of the capacitance of the capacitor Cn is 0.1 pF, and the tolerance of the inductance of the inductor Ln is 0.4 nF. Simulated were the transmission characteristic of the notch circuit 14 under the assumption that the inductance of the inductor Ln is 2.5 nH and the capacitance of the capacitor Cn is 0.3 pF, 0.4 pF, or 0.5 pF and the transmission characteristic of the notch circuit 14 under the assumption that the capacitance of the capacitor Cn is 0.4 pF and the inductance of the inductor Ln is 2.4 nH, 2.5 nH, or 2.6 nH.

Figure 3A:
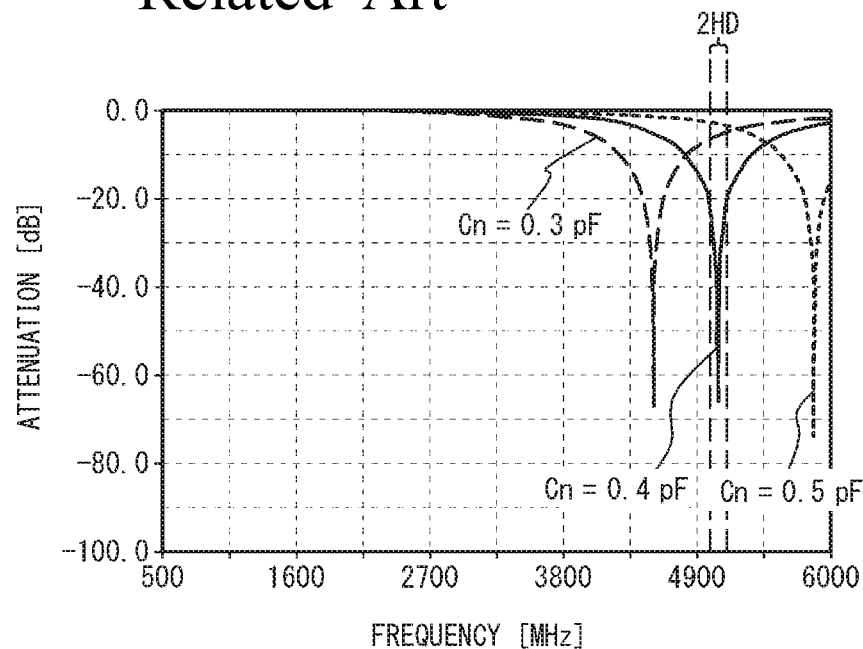
FIG. 3A and FIG. 3B illustrate the transmission characteristics of a notch circuit in the second comparative example.
Figure 3B:
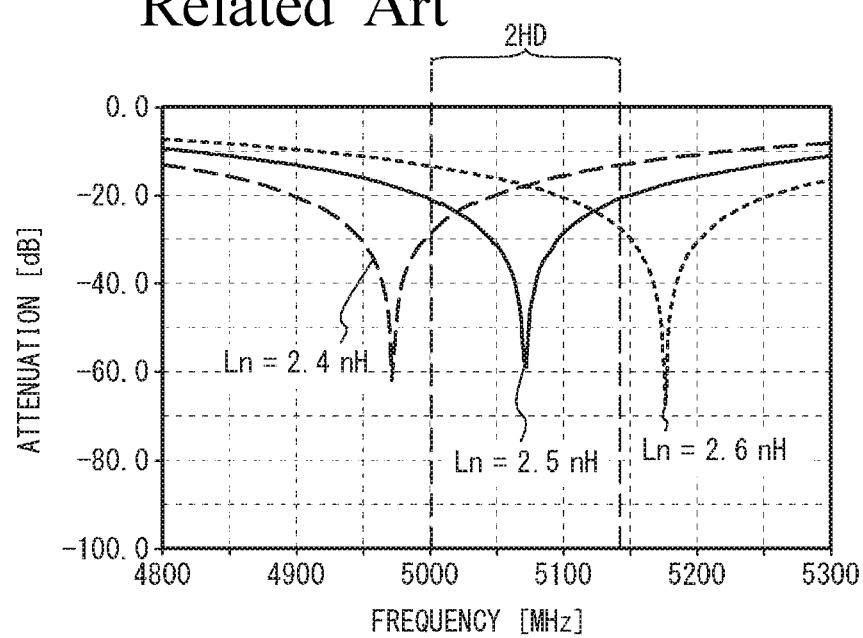

FIG. 3A and FIG. 3B illustrate the transmission characteristics of the notch circuit in the second comparative example. In FIG. 3A, the capacitance is varied, and in FIG. 3B, the inductance is varied. As illustrated in FIG. 3A and FIG. 3B, when the capacitance and the inductance vary to the extent of tolerance, the suppression band of the notch circuit 14 is out of the frequency band 2 HD. As seen above, when the notch circuit 14 is formed of chip components, the variation in the suppression band increases. In addition, the chip component is large in size, and the duplexer size therefore increases.

As a countermeasure, it may be considered to form the capacitor Cn on the single substrate 20 on which the transmit filter 10 is also formed. It may be considered to use as the capacitor Cn a Metal Insulator Metal (MIM) capacitor using a dielectric for the piezoelectric film of the piezoelectric thin film resonator. However, when the piezoelectric film is made of a dielectric, the capacitor Cn itself generates unnecessary spurious such as second harmonics.

It may be also considered to form another dielectric film such as a silicon oxide film on the substrate 20 and use the MIM capacitor using the dielectric film as the capacitor Cn. However, the step for forming another dielectric film on the substrate 20 complicates the fabrication process.

It may be considered to apply Patent Document 3 to the second comparative example and form a notch circuit with use of a surface acoustic wave resonator. Unlike the piezoelectric thin film resonator, the surface acoustic wave resonator has a small occurrence rate of second harmonics. However, to increase the resonant frequency, the pitch of the electrode fingers is to be decreased. To form the resonant frequency in a 5 GHz band that is twice the 2.5 GHz band such as, for example, Band7, Band40, or Band41, the width of the electrode finger is to be 200 nm or less. Forming such fine electrode fingers is difficult.

It may be considered to apply Patent Document 9 to the first comparative example to reduce the second harmonic generated in the piezoelectric thin film resonator by dividing the piezoelectric thin film resonator. FIG. 4A and FIG. 4B are plan views of the transmit filter before and after piezoelectric thin film resonators are divided, respectively. As illustrated in FIG. 4A, piezoelectric thin film resonators 21, wiring lines 26, and pads 28 are located on the substrate 20. The piezoelectric thin film resonators 21 include the series resonators S11 through S14 and the parallel resonators P11 through P13. The pads 28 include a common pad Pant, a transmit pad Ptx, and ground pads Pgnd. The wiring lines 26 electrically interconnect the piezoelectric thin film resonators 21 and/or electrically connect the piezoelectric thin film resonator 21 to the pad 28. The series resonators S11 through S14 are connected in series between the common pad Pant and the transmit pad Ptx through the wiring lines 26. The parallel resonators P11 through P13 are connected in parallel between the common pad Pant and the transmit pad Ptx through the wiring lines 26.

As illustrated in FIG. 4B, the series resonator S11 is serially divided into resonators S11a and S11b. The parallel resonator P11 is serially divided into resonators P11a and P11b. This structure reduces the second harmonics generated in the series resonator S11 and the parallel resonator P11. However, since the number of the piezoelectric thin film resonators 21 increases, the chip size increases compared to the structure of FIG. 4A. In addition, the second harmonics are not sufficiently reduced because of the parasitic capacitances due to the wiring line 26 between the resonators S11a and S11b and the wiring line 26 between the resonators P11a and P11b.

Hereinafter, embodiments for solving the above problems will be described.

First Embodiment

Figure 5:
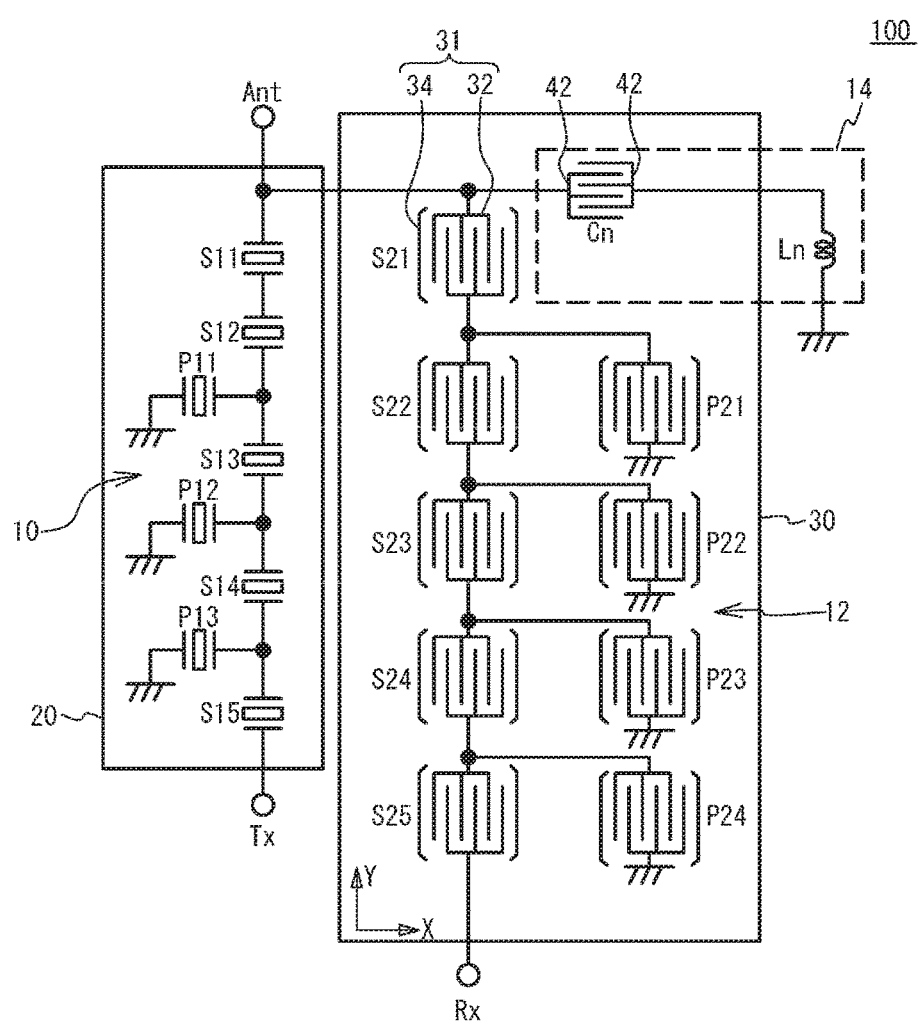
FIG. 5 is a circuit diagram of a duplexer in accordance with a first embodiment.

FIG. 5 is a circuit diagram of a duplexer in accordance with a first embodiment. As illustrated in FIG. 5, a duplexer 100 includes the transmit filter 10, the receive filter 12, and the notch circuit 14. The receive filter 12 is a ladder-type filter, and includes series resonators S21 through S25 and parallel resonators P21 through P24. The series resonators S21 through S25 are connected in series between the common terminal Ant, which is coupled to an antenna, and the receive terminal Rx. The parallel resonators P21 through P24 are connected in parallel between the common terminal Ant and the receive terminal Rx. The series resonators S21 through S25 and the parallel resonators P21 through P24 are surface acoustic wave resonators 31, and are located on a piezoelectric substrate 30.

The surface acoustic wave resonator 31 includes an Interdigital Transducer (IDT) 32 and reflectors 34. The surface acoustic wave of the surface acoustic wave resonator 31 propagates in the X direction. The electrode fingers of the IDT 32 extend in the Y direction. The capacitor Cn and the inductor Ln of the notch circuit 14 are connected in series between the common terminal Ant and a ground without a resonator. The capacitor Cn of the notch circuit 14 is located on the piezoelectric substrate 30. The capacitor Cn includes a pair of electrodes 42 facing each other in the planar direction. The electrode fingers of the electrode 42 extend in the X direction. The inductor Ln is located outside the piezoelectric substrate 30. Other structures are the same as those of the first and second comparative examples, and the description thereof is thus omitted.

Figure 6A:
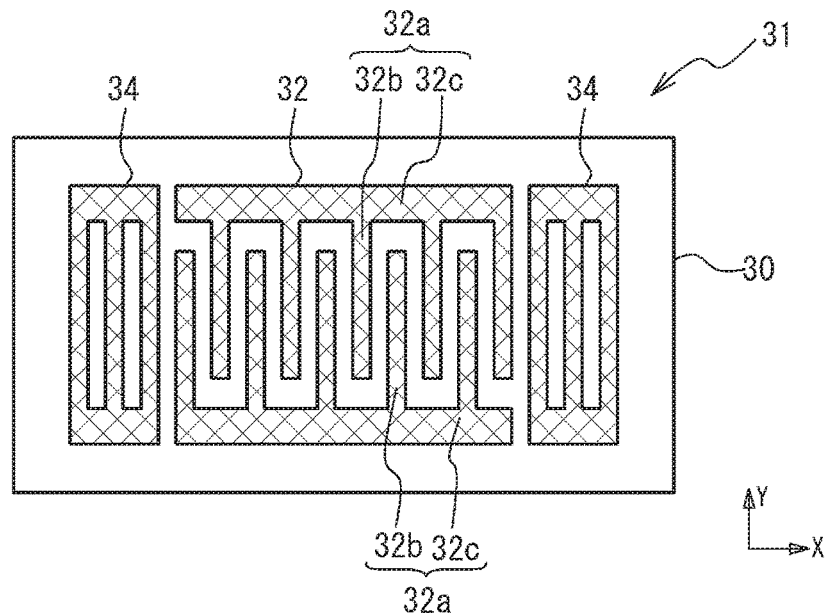
FIG. 6A is a plan view of a surface acoustic wave resonator in a receive filter.
Figure 6B:
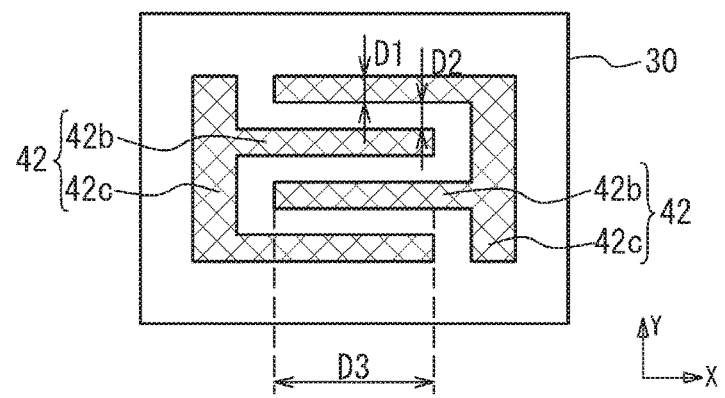
FIG. 6B is a plan view of a capacitor.
Figure 6C:
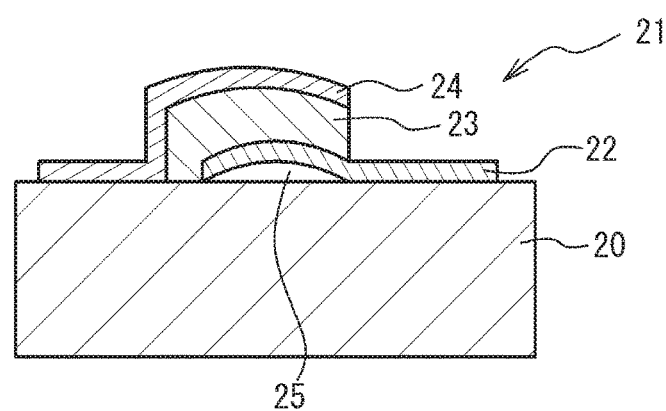
FIG. 6C is a cross-sectional view of a piezoelectric thin film resonator in a transmit filter.

FIG. 6A is a plan view of the surface acoustic wave resonator in the receive filter, FIG. 6B is a plan view of the capacitor, and FIG. 6C is a cross-sectional view of the piezoelectric thin film resonator in the transmit filter. As illustrated in FIG. 6A, the IDT 32 and the reflectors 34 are formed on the piezoelectric substrate 30. The piezoelectric substrate 30 is, for example, a lithium tantalate substrate or a lithium niobate substrate. The piezoelectric substrate 30 may be bonded on the upper surface of a support substrate such as a sapphire substrate, a spinel substrate, an alumina substrate, or a silicon substrate. The IDT 32 includes a pair of comb-shaped electrodes 32a facing each other. The comb-shaped electrode 32a includes a plurality of electrode fingers 32b and a bus bar 32c to which the electrode fingers 32b are coupled. The electrode fingers 32b are arranged in the X direction, and extend in the Y direction. The reflectors 34 are located at both sides of the IDT 32.

The IDT 32 excites a surface acoustic wave on the piezoelectric substrate 30. The surface acoustic wave propagates in the X direction. When the piezoelectric substrate 30 is a rotated Y-cut X-propagation substrate, the X-axis orientation of the crystal orientation corresponds to the X direction. The wavelength of the surface acoustic wave corresponds to the pitch λ of the electrode fingers 32b. The IDT 32 and the reflectors 34 are formed of a metal layer such as an aluminum (Al) layer or a copper (Cu) layer. A protective film or a temperature compensation film made of an insulating material may be formed on the IDT 32 and the reflectors 34.

As illustrated in FIG. 6B, a pair of electrodes 42 are formed on the piezoelectric substrate 30. The electrode 42 includes a plurality of electrode fingers 42b and a bus bar 42c to which the electrode fingers 42b are coupled. The electrode fingers 42b face each other in the planar direction. The electrode fingers 42b extend in the X direction. The width of the electrode finger 42b is represented by D1, the distance between the electrode fingers 42b is represented by D2, and the aperture length is represented by D3. The electrode 42 may be formed of the same metal layer as or a different metal layer from the IDT 32 and the reflectors 34. When the pair of electrodes 42 are comb-shaped electrodes and the pair of electrodes 42 functions as a resonator, the notch circuit 14 functions as a high-pass filter like a parallel resonator of a ladder-type filter.

Thus, the resonant frequency of the pair of electrodes 42 is made to be sufficiently lower than the passbands of the transmit filter 10 and the receive filter 12. When the pitch of the electrode fingers 42b is greater than the pitch λ of the electrode fingers 32b of the IDT 32, the resonant frequency decreases. As a result, the pair of electrodes 42 functions as the capacitor Cn in the passbands of the transmit filter 10 and the receive filter 12 and at frequencies higher than the passbands of the transmit filter 10 and the receive filter 12. In this structure, the area of the pair of electrodes 42 is large. Thus, the extension direction of the electrode fingers 42b is made to be the Y direction. This structure makes the pair of electrodes 42 hardly excite the surface acoustic wave. Thus, the pair of electrodes 42 functions as the capacitor Cn. The extension directions of the electrode fingers 42b and 32b preferably intersect at a right angle, but it is sufficient if the extension directions of the electrode fingers 42b and 32b intersect.

As illustrated in FIG. 6C, a piezoelectric film 23 is located on the substrate 20. The substrate 20 is an insulating substrate such as, for example, a sapphire substrate, a spinel substrate, or an alumina substrate, or a semiconductor substrate such as a silicon substrate. A lower electrode 22 and an upper electrode 24 are located so as to sandwich the piezoelectric film 23. An air gap 25 is formed between the lower electrode 22 and the substrate 20. The lower electrode 22 and the upper electrode 24 excite the acoustic wave in the thickness extension mode inside the piezoelectric film 23. The lower electrode 22 and the upper electrode 24 are formed of a metal film such as, for example, a ruthenium film. The piezoelectric film 23 is, for example, an aluminum nitride film. The piezoelectric thin film resonator 21 and the surface acoustic wave resonator 31 include electrodes that excite the acoustic wave.

The transmission characteristic and the second harmonic of the first embodiment were simulated.

Piezoelectric film 23: Aluminum nitride film
Piezoelectric substrate 30: 42° rotated Y-cut X-propagation lithium tantalate substrate
Capacitor Cn
Electrode 42: Al film with a film thickness of 150 nm
Widths D1 and D2 of electrode fingers: 800 nm
Aperture length D3: 40 µm
Number of pairs: 32 pairs
Inductor Ln
Inductance: 3.5 nH
Q-value: Infinite The transmission characteristic and the second harmonic characteristic of a duplexer without the notch circuit 14 in accordance with the first comparative example were also simulated.

Figure 7A:
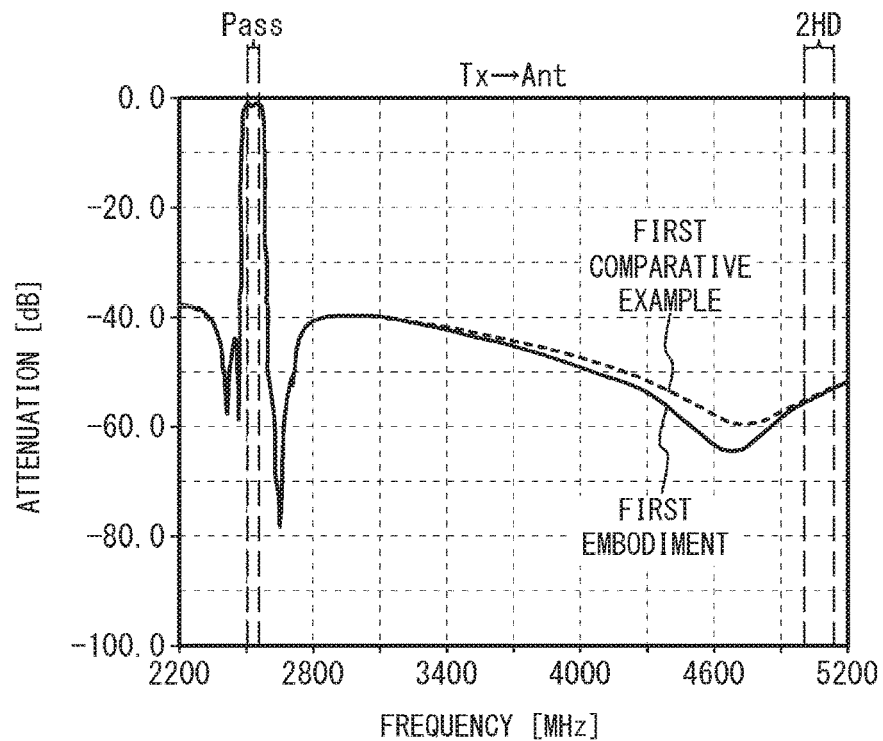
FIG. 7A and FIG. 7B illustrate the transmission characteristic from a transmit terminal to a common terminal of the transmit filter in the first embodiment.
Figure 7B:
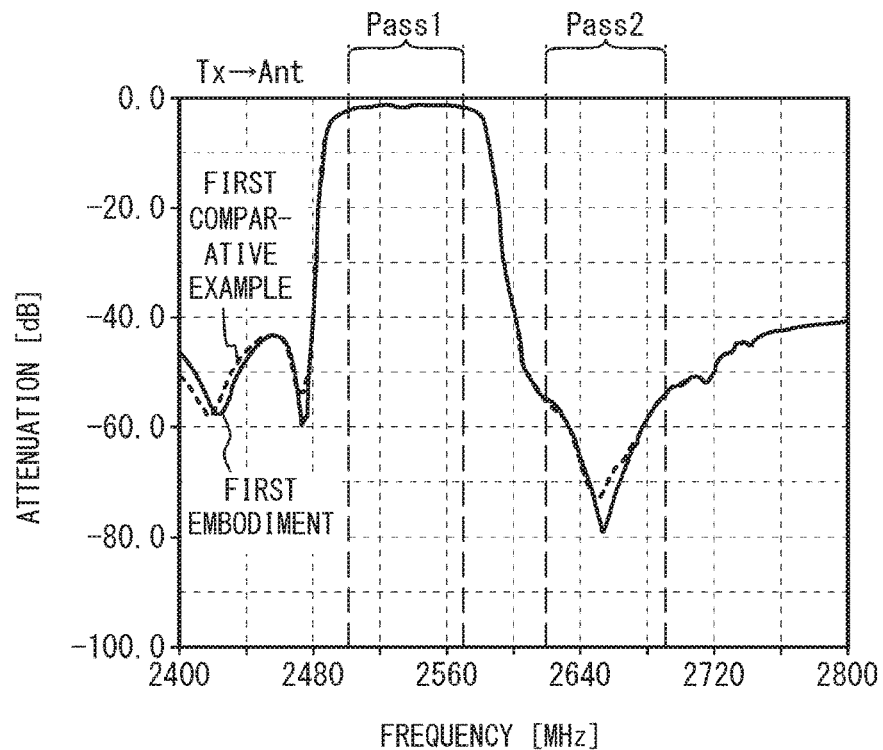

FIG. 7A and FIG. 7B illustrate the transmission characteristic from the transmit terminal to the common terminal of the transmit filter in the first embodiment. The solid lines indicate the first embodiment, and the dashed lines indicate the first comparative example. As illustrated in FIG. 7A and FIG. 7B, the transmission characteristic and the suppression characteristic of the transmit filter 10 of the first embodiment are substantially the same as those of the first comparative example at frequencies higher than the passband Pass and within the transmit band Pass1 and the receive band Pass2. The attenuation pole around 4600 MHz is due to an inductor connected between the parallel resonator of the transmit filter 10 and a ground. Since the second harmonics are generated in the series resonator S15 and the parallel resonator P13, which are located closest to the common terminal Ant, of the transmit filter 10, this attenuation pole hardly contributes to the reduction of the second harmonics.

Figure 8A:
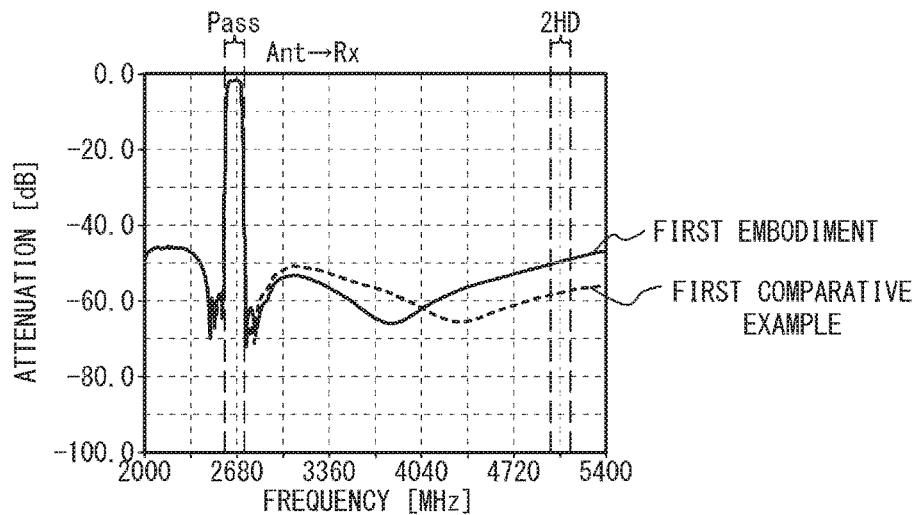
FIG. 8A and FIG. 8B illustrate the transmission characteristic from the common terminal to a receive terminal of the receive filter in the first embodiment.
Figure 8B:
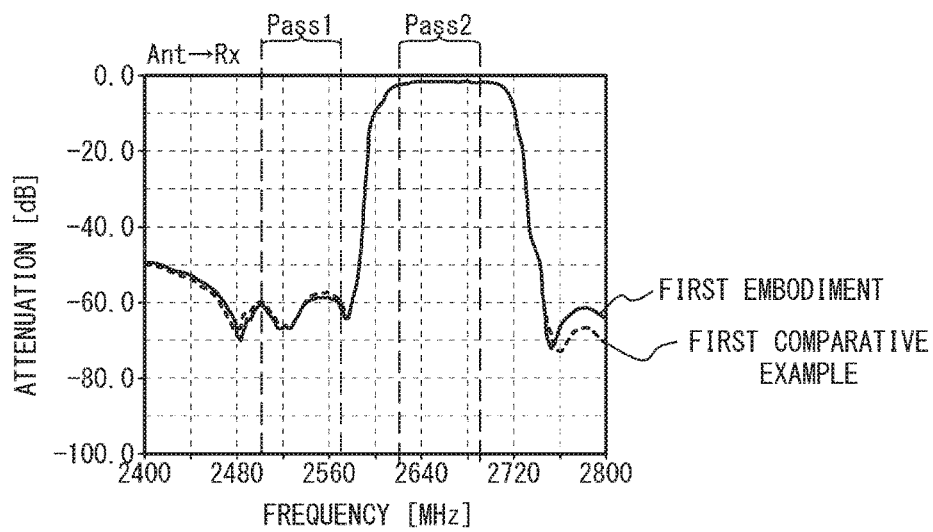
Figure 8C:
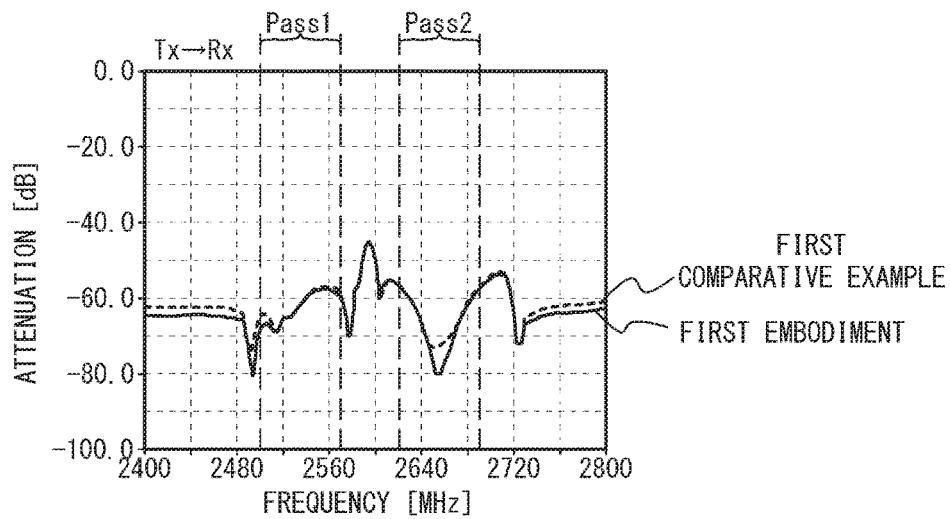
FIG. 8C illustrates isolation characteristics from the transmit terminal to the receive terminal in the first embodiment.

FIG. 8A and FIG. 8B illustrate the transmission characteristic from the common terminal to the receive terminal of the receive filter in the first embodiment. FIG. 8C illustrates isolation characteristics from the transmit terminal to the receive terminal in the first embodiment. As illustrated in FIG. 8A and FIG. 8B, the transmission characteristic and the suppression characteristic of the receive filter 12 of the first embodiment are substantially the same as those of the first comparative example at frequencies higher than the passband Pass and within the transmit band Pass1 and the receive band Pass2. As illustrated in FIG. 8C, the isolation characteristic of the first embodiment is approximately the same as that of the first comparative example in the transmit band Pass1 and the receive band Pass2.

As illustrated in FIG. 7A through FIG. 8C, the deterioration of the transmission characteristics, the suppression characteristics, and the isolation characteristics due to the provision of the notch circuit 14 hardly occurs.

The second harmonic was then simulated. Simulated was the second harmonic output from the common terminal Ant when a high-frequency signal with a frequency from 2500 MHz to 2570 MHz and an electric power of 28 dBm is applied to the transmit terminal Tx. The second harmonic can be calculated based on a non-linear electric current that is proportional to the "square of the intensity of the electric field" applied to the piezoelectric film 23 of the piezoelectric thin film resonator 21, the "product of the electric field intensity and the strain", and the "square of the strain".

Figure 9A:
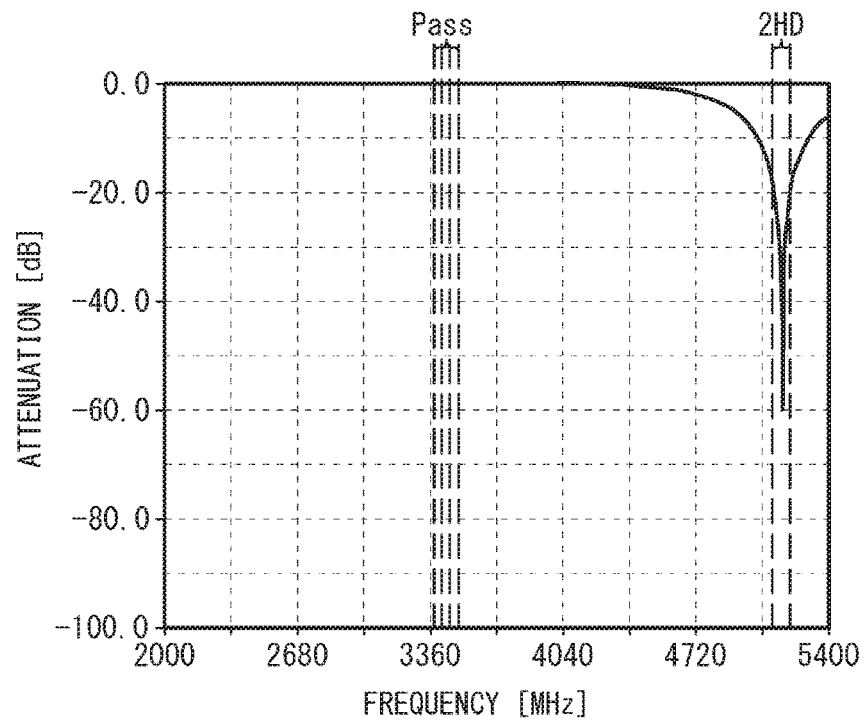
FIG. 9A illustrates the transmission characteristic of the notch circuit in the first embodiment.
Figure 9B:
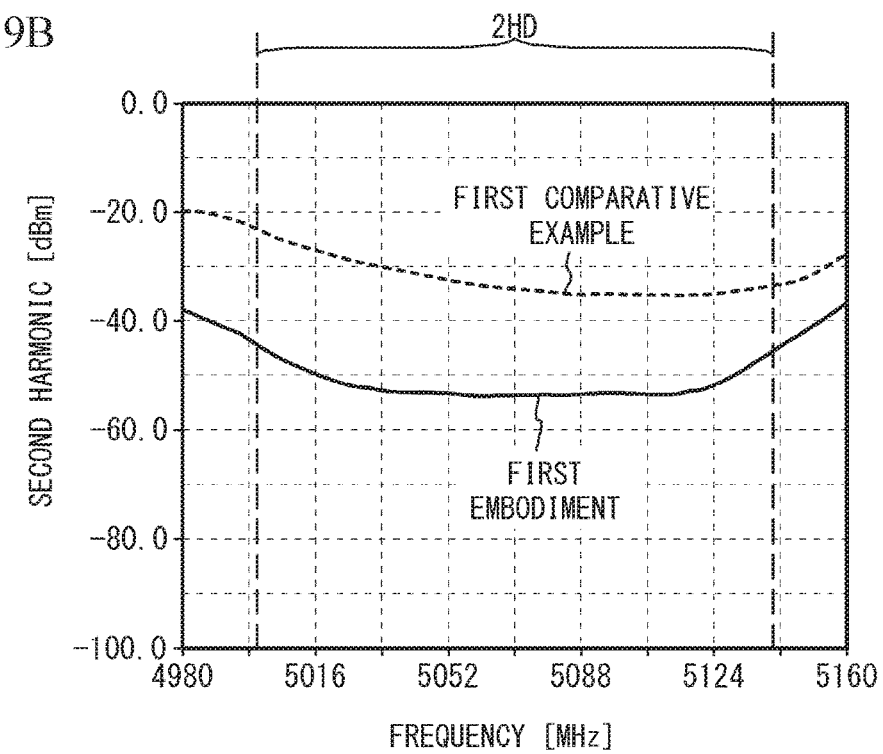
FIG. 9B illustrates second harmonics.

FIG. 9A illustrates the transmission characteristic of the notch circuit in the first embodiment, and FIG. 9B illustrates second harmonics. As illustrated in FIG. 9A, the notch circuit 14 has a suppression band within the frequency band 2 HD of the second harmonic. To reduce the insertion loss of the notch circuit 14 at frequencies from 1 GHz to 2.5 GHz in which the passband Pass is located, the capacitance of the capacitor Cn is preferably 1 pF or less, and the inductance of the inductor Ln is preferably 2 nH or greater.

As illustrated in FIG. 9B, the second harmonic in the frequency band 2 HD in the first embodiment is smaller than the second harmonic in the first comparative example. The worst value of the second harmonic in the frequency band 2 HD is −23 dBm in the first comparative example, and is −44 dBm in the first embodiment. As described above, the first embodiment can reduce the second harmonic by approximately 20 dBm.

First Variation of First Embodiment

Figure 10A:
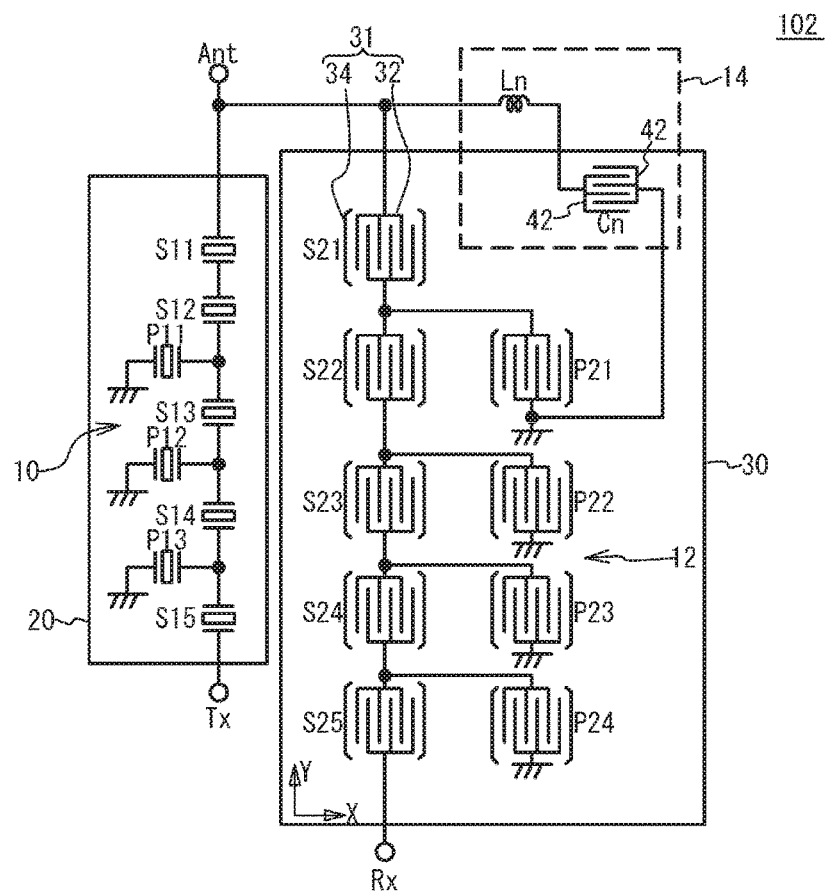
FIG. 10A is a circuit diagram of a first variation of the first embodiment.
Figure 10B:
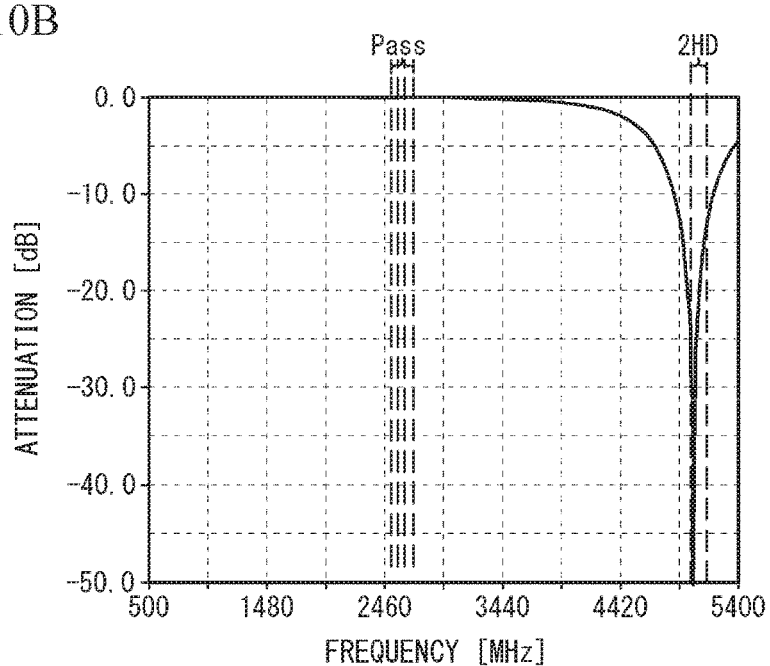
FIG. 10B illustrates the transmission characteristic of the notch circuit.

FIG. 10A is a circuit diagram of a first variation of the first embodiment, and FIG. 10B illustrates the transmission characteristic of the notch circuit. As illustrated in FIG. 10A, in a duplexer 102, the inductor Ln of the notch circuit 14 is coupled to the common terminal Ant, and the capacitor Cn is coupled to a ground. Other structures are the same as those of the first embodiment, and the description thereof is thus omitted.

The transmission characteristic of the notch circuit 14 was simulated under the assumption that the capacitance of the capacitor Cn is 0.25 pF and the inductance of the inductor Ln is 4.0 nH. As illustrated in FIG. 10B, even when the capacitor Cn and the inductor Ln are located in reverse, the notch circuit 14 having the same transmission characteristic as the notch circuit of the first embodiment can be formed. As in the first embodiment, the capacitance of the capacitor Cn is preferably 1 pF or less, and the inductance of the inductor Ln is preferably 2 nH or less.

Second Variation of First Embodiment

Figure 11A:
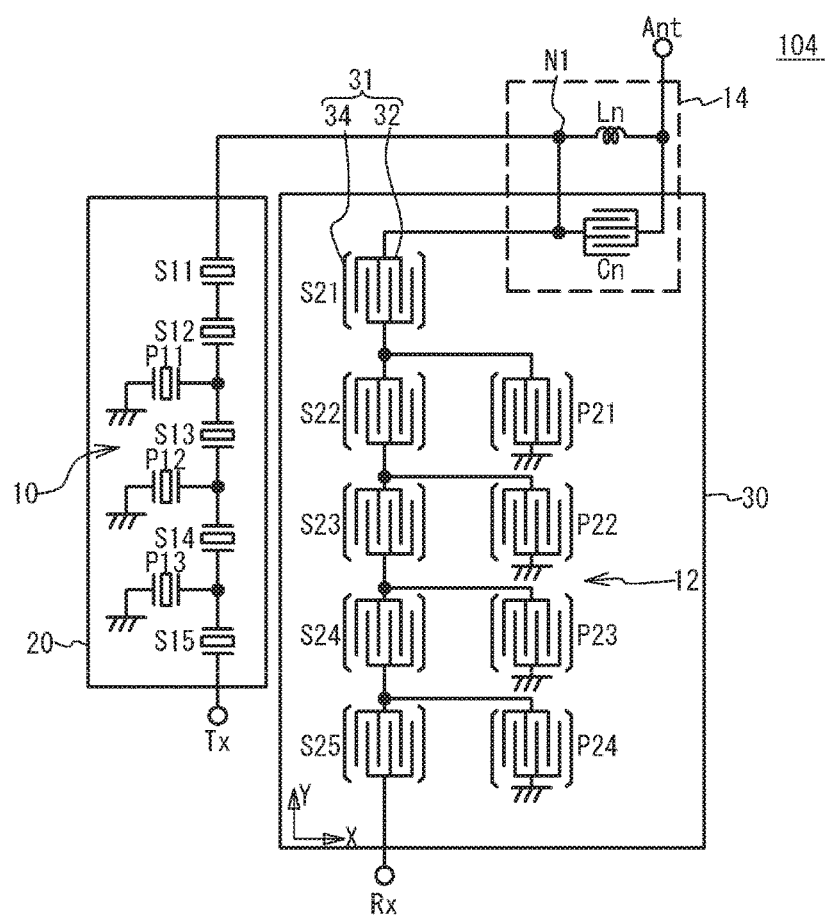
FIG. 11A is a circuit diagram of a second variation of the first embodiment.
Figure 11B:
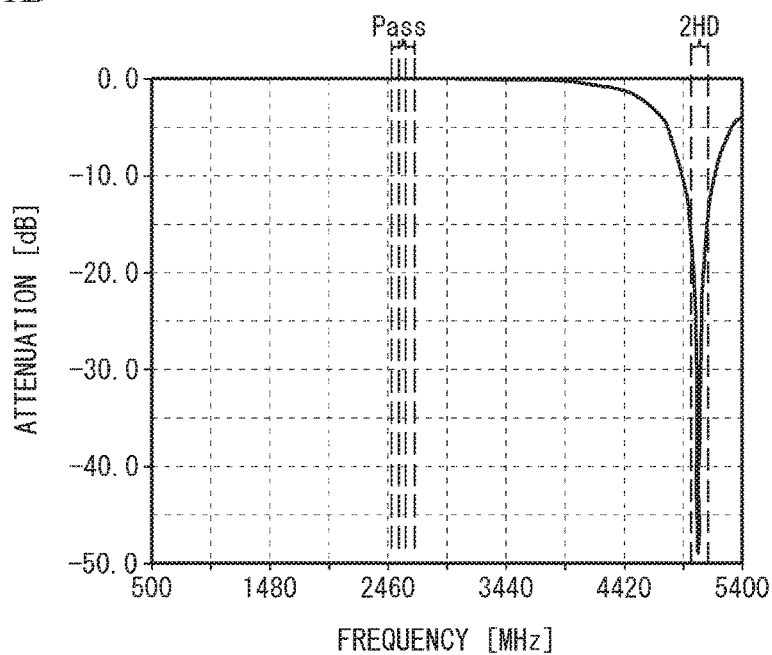
FIG. 11B illustrates the transmission characteristic of the notch circuit.

FIG. 11A is a circuit diagram of a second variation of the first embodiment, and FIG. 11B illustrates the transmission characteristic of the notch circuit. As illustrated in FIG. 11A, in a multiplexer 104, the notch circuit 14 is connected between the common terminal Ant and a node N1. The node N1 is a node to which the transmit filter 10 and the receive filter 12 are commonly coupled. The capacitor Cn and the inductor Ln are connected in parallel between the common terminal Ant and the node N1. Other structures are the same as those of the first embodiment, and the description thereof is thus omitted.

The transmission characteristic of the notch circuit 14 was simulated under the assumption that the capacitance of the capacitor Cn is 1.975 pF and the inductance of the inductor Ln is 0.5 nH. As illustrated in FIG. 11B, the notch circuit 14 having the same transmission characteristic as the notch circuit of the first embodiment is also formed in the second variation of the first embodiment. To reduce the insertion loss of the notch circuit 14 at frequencies from 1 GHz to 2.5 GHz in which the passband Pass is located, the capacitance of the capacitor Cn is preferably 0.3 pF or greater, and the inductance of the inductor Ln is preferably 3 nH or less.

Third Variation of First Embodiment

Figure 12:
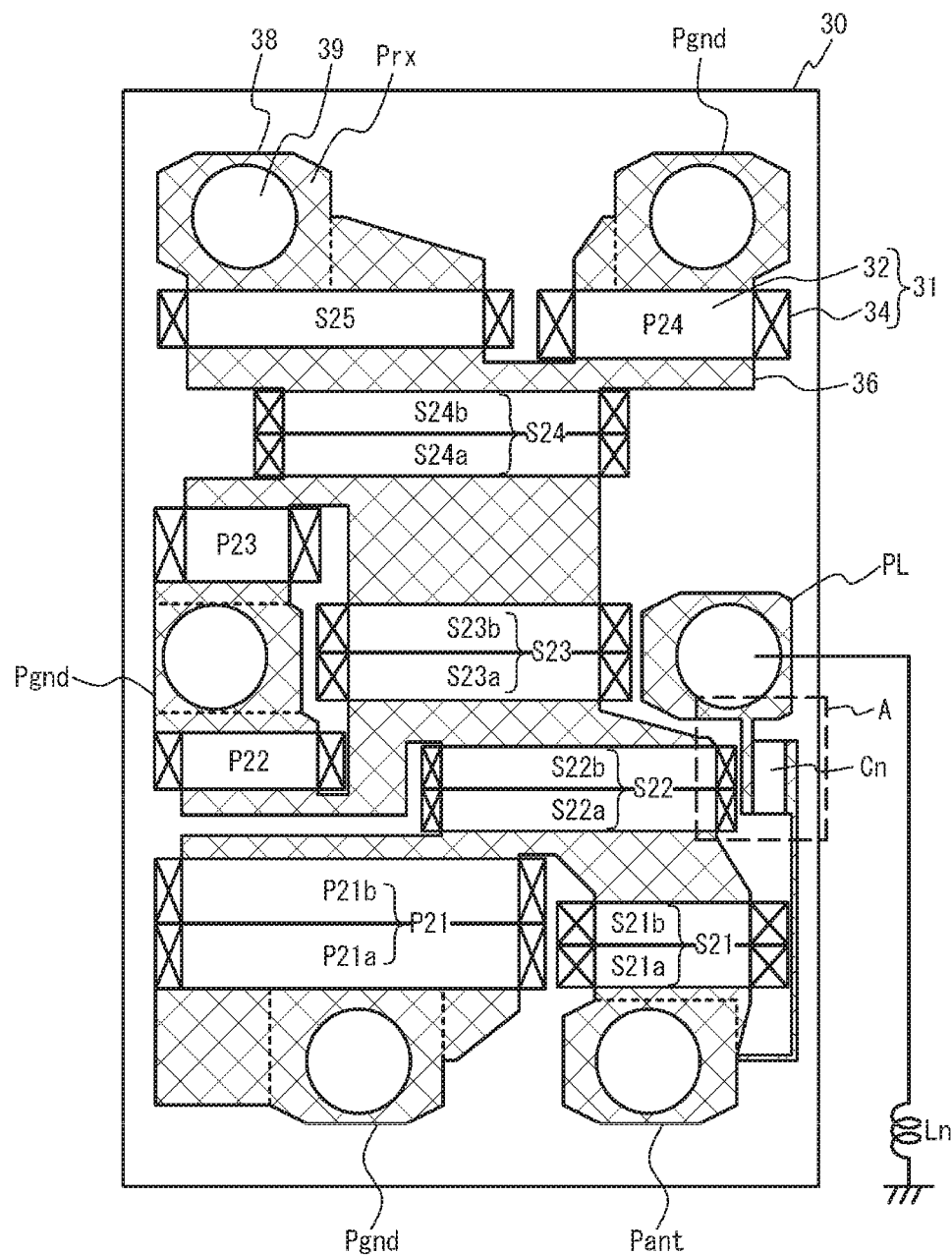
FIG. 12 is a plan view of a piezoelectric substrate in a third variation of the first embodiment.

Third to sixth variations of the first embodiment describe tangible examples of the receive filter 12 and the capacitor Cn formed on the piezoelectric substrate 30. FIG. 12 is a plan view of a piezoelectric substrate in the third variation of the first embodiment. As illustrated in FIG. 12, a plurality of surface acoustic wave resonators 31, the capacitor Cn, wiring lines 36, and pads 38 are located on the piezoelectric substrate 30. Each surface acoustic wave resonator 31 is a one-port resonator, and includes the IDT 32 and the reflectors 34. The surface acoustic wave resonators 31 include the series resonators S21 through S25 and the parallel resonators P21 through P24. The pads 38 include the common pad Pant, a receive pad Prx, an inductor connection pad PL, and the ground pads Pgnd. The wiring lines 36 electrically connects the surface acoustic wave resonators 31 to each other, the surface acoustic wave resonator 31 to the pad 38, and/or the capacitor Cn to the pad 38. The wiring lines 36 and the pads 38 are formed of a metal layer such as, for example, a Cu layer, an Au layer, or an Al layer. Bumps 39 are located on the pads 38.

The series resonators S21 through S25 are connected in series between the common pad Pant and the receive pad Prx through the wiring lines 36. The parallel resonators P21 through P24 are connected in parallel between the common pad Pant and the receive pad Prx through the wiring lines 36. The capacitor Cn is connected between the common pad Pant and the inductor connection pad PL. The inductor connection pad PL is grounded through the inductor Ln. The series resonators S21, S22, S23, and S24 are serially divided into resonators S21a and S21b, resonators S22a and S22b, resonators S23a and S23b, and resonators S24a and S24b, respectively. The parallel resonator P21 is serially divided into resonators P21a and P21b.

Figure 13:
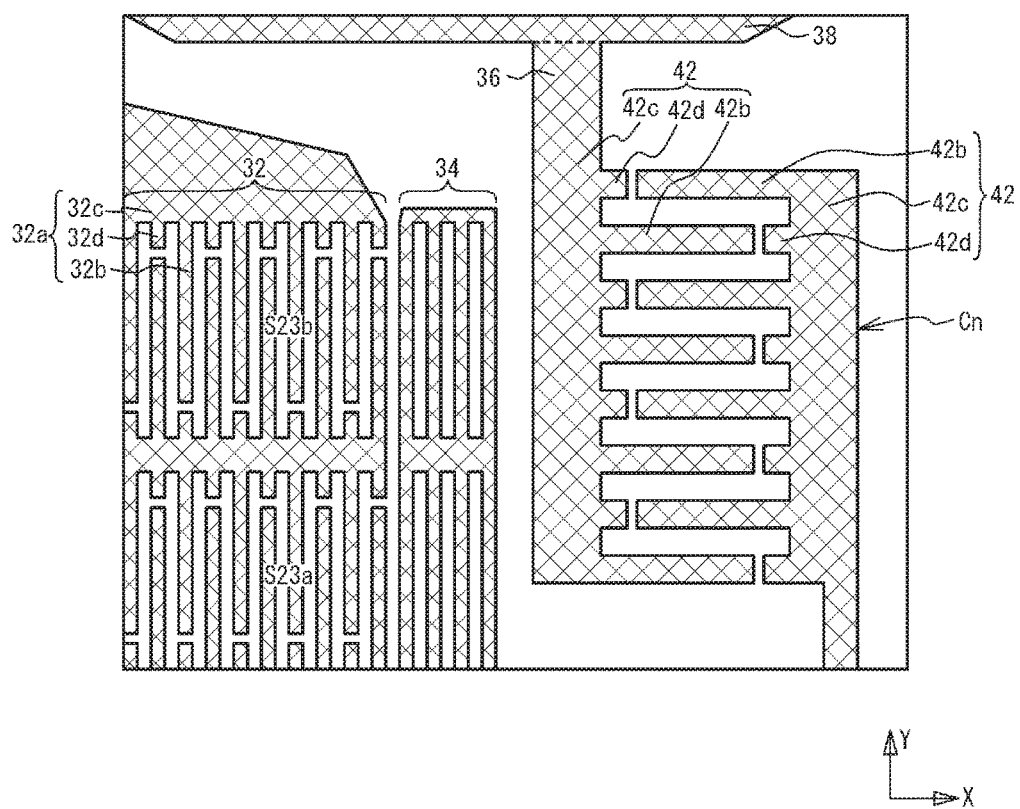
FIG. 13 is an enlarged view of an area A of FIG. 12 in the third variation of the first embodiment.

FIG. 13 is an enlarged view of an area A in FIG. 12 in the third variation of the first embodiment. For simplicity's sake, in the drawing, the pitch of the electrode fingers 32b and the pitch of the electrode fingers 42b are widened, and the number of pairs is reduced. As illustrated in FIG. 13, the electrode 42 includes a plurality of dummy electrode fingers 42d facing to the plurality of electrode fingers 42b in the X direction. The IDT 32 include a plurality of dummy electrode fingers 32d facing the plurality of electrode fingers 32b in the Y direction. The extension direction of the electrode fingers 32b of the IDT 32 intersects with the extension direction of the electrode fingers 42b of the electrode 42 at a right angle. This structure makes it difficult to excite a surface acoustic wave by the electrodes 42. In addition, the pitch of the electrode fingers 42b is greater than the pitch of the electrode fingers 32b. These configurations reduce the interference between the electrodes 42 and the IDT 32. Other structures are the same as those of the first embodiment, and the description thereof is thus omitted. As described in the third variation of the first embodiment, the IDT 32 and the electrodes 42 may include the dummy electrode fingers 32d and 42d, respectively.

Fourth Variation of First Embodiment

Figure 14:
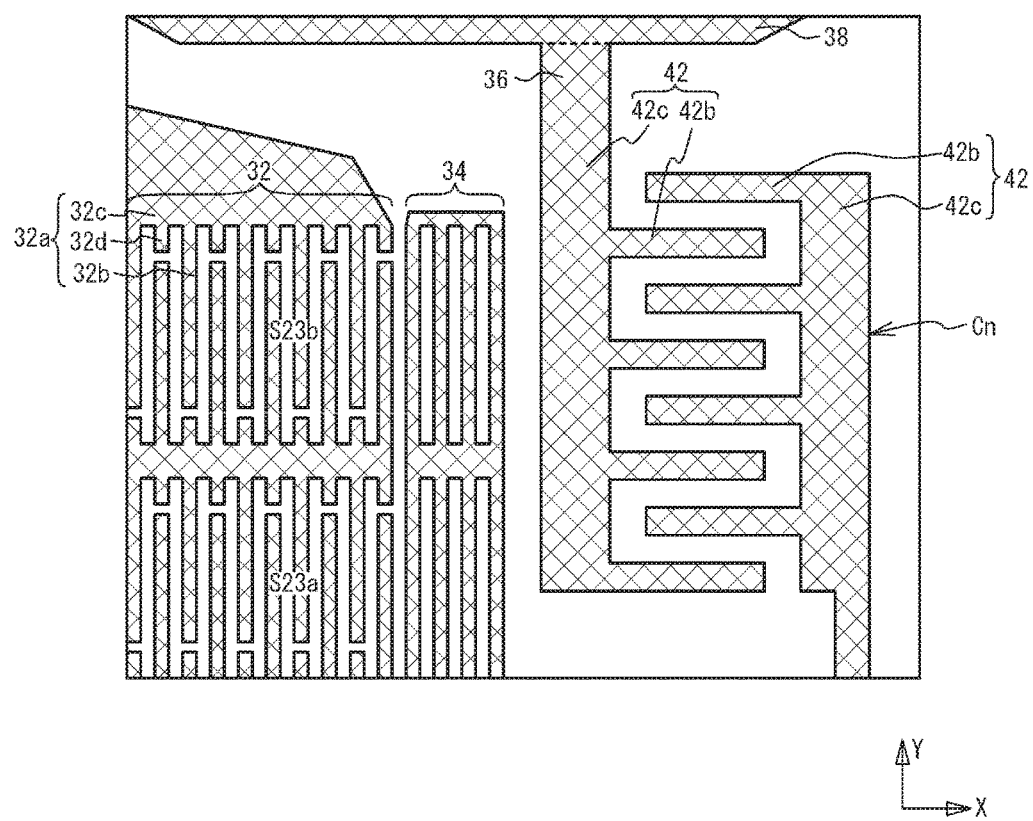
FIG. 14 is an enlarged view around the capacitor in a fourth variation of the first embodiment.

FIG. 14 is an enlarged view around the capacitor in the fourth variation of the first embodiment. As illustrated in FIG. 14, the electrode 42 may not necessarily include dummy electrodes. Other structures are the same as those of the third variation of the first embodiment, and the description thereof is thus omitted.

Fifth Variation of First Embodiment

Figure 15:
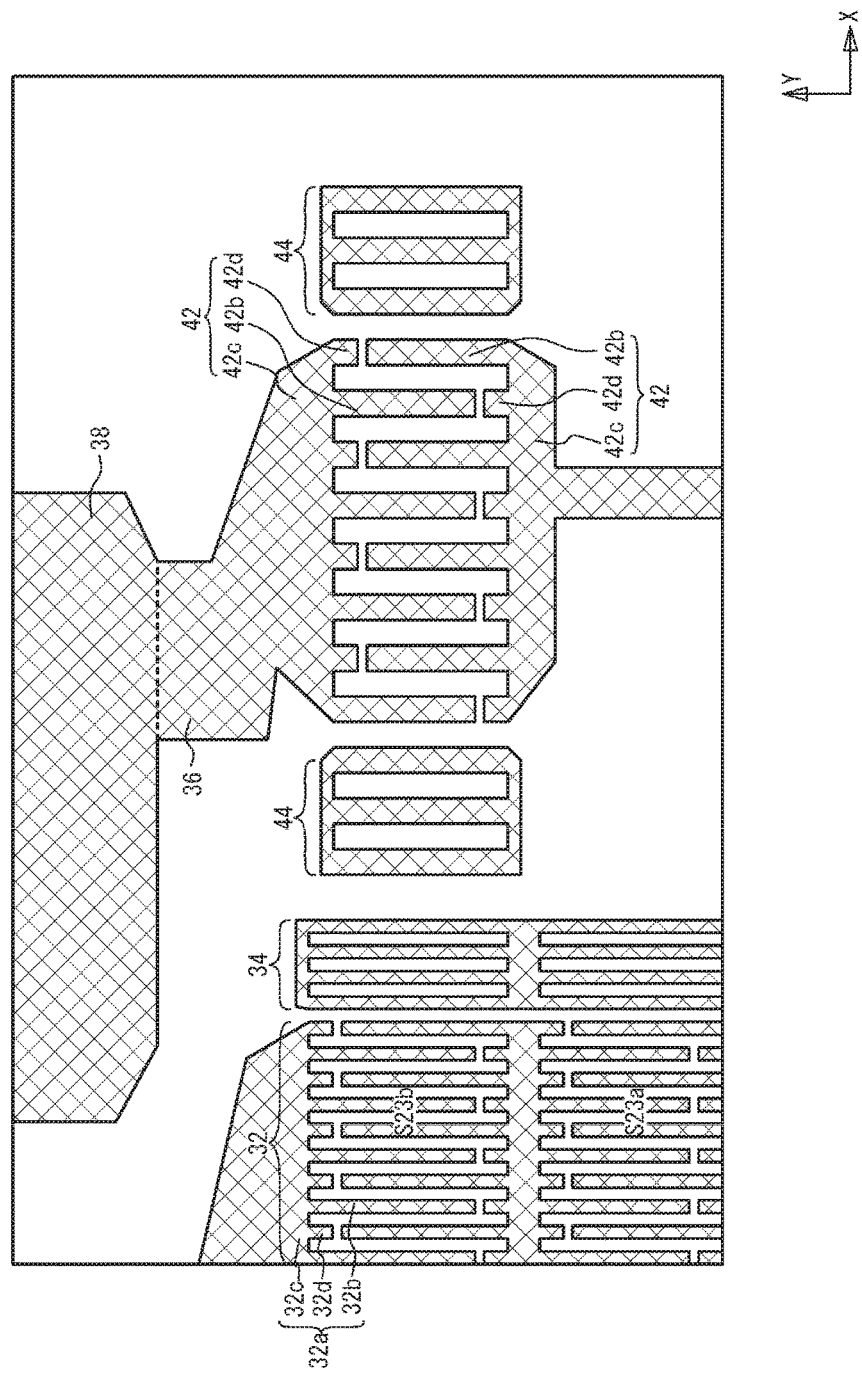
FIG. 15 is an enlarged view around the capacitor in a fifth variation of the first embodiment.

FIG. 15 is an enlarged view around the capacitor in the fifth variation of the first embodiment. As illustrated in FIG. 15, the electrode fingers 42b of the electrode 42 are arranged in the X direction, and extend in the Y direction. Reflectors 44 are located at both sides of the electrodes 42 in the X direction. Other structures are the same as those of the third variation of the first embodiment, and the description thereof is thus omitted.

As described in the fifth variation of the first embodiment, the extension direction of the electrode fingers 32b of the IDT 32 may be parallel to the extension direction of the electrode fingers 42b of the electrodes 42. In this structure, the surface acoustic wave excited by the electrodes 42 may affect the IDT 32. Thus, the reflectors 44 that reflect the surface acoustic wave excited by the electrodes 42 are located at both sides of the electrodes 42. This structure reduces the interference between the electrodes 42 and the IDT.

Sixth Variation of First Embodiment

Figure 16:
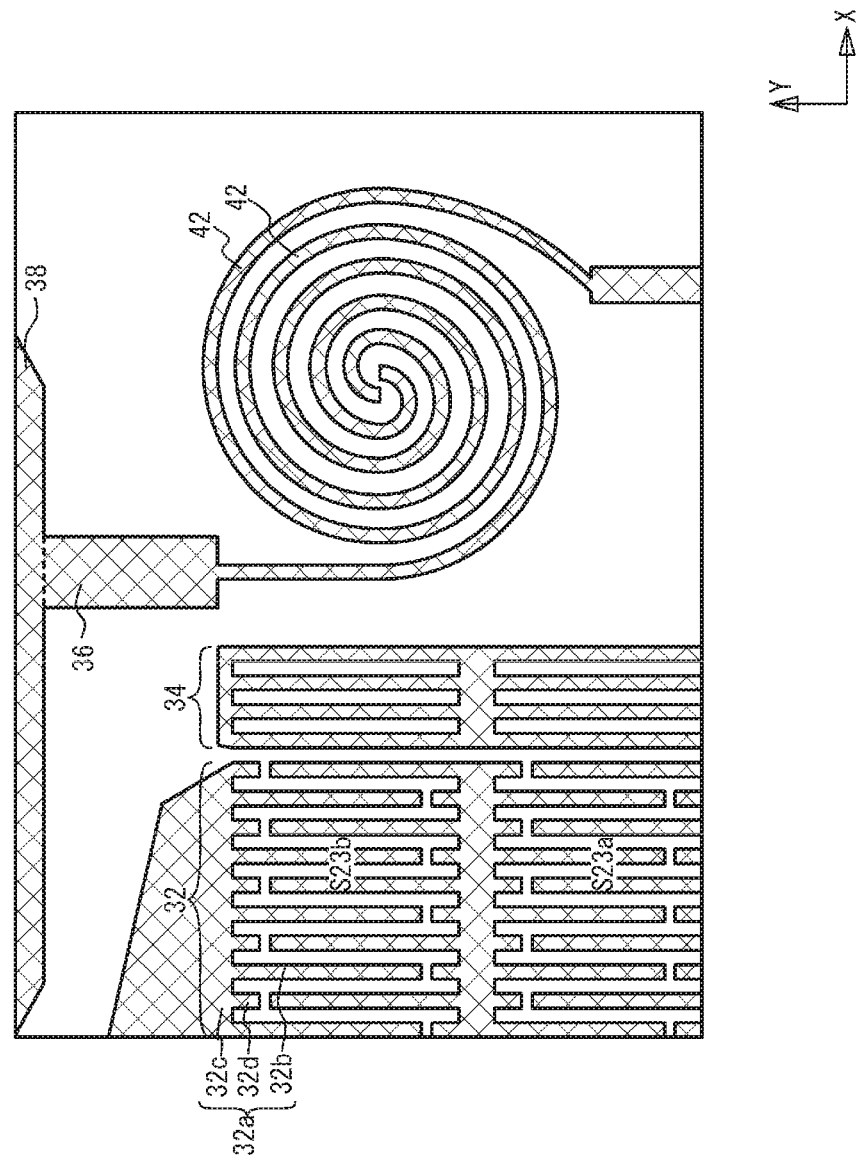
FIG. 16 is an enlarged view around the capacitor in a sixth variation of the first embodiment.

FIG. 16 is an enlarged view around the capacitor in the sixth variation of the first embodiment. As illustrated in FIG. 16, the pair of electrodes 42 are spiral shaped, and face each other in the planar direction. Other structures are the same as those of the third variation of the first embodiment, and the description thereof is thus omitted. As in the sixth variation of the first embodiment, the pair of electrodes 42 may not be necessarily comb-shaped electrodes.

The piezoelectric substrate 30 has a large relative permittivity. For example, lithium tantalate has a relative permittivity of approximately 40, while lithium niobate has a relative permittivity of approximately 85. Thus, the area of the capacitor Cn can be reduced by providing the pair of electrodes 42 on the piezoelectric substrate 30. When the electrode 42 is located on the piezoelectric substrate 30, the power durability is small. However, when the capacitor Cn is connected in parallel to the signal pathway as in the first embodiment, the impedance of the notch circuit 14 in the passband increases, and large electric current flows to the common terminal Ant through the signal pathway. Therefore, the electrodes 42 are inhibited from being damaged.

Seventh Variation of First Embodiment

Figure 17A:
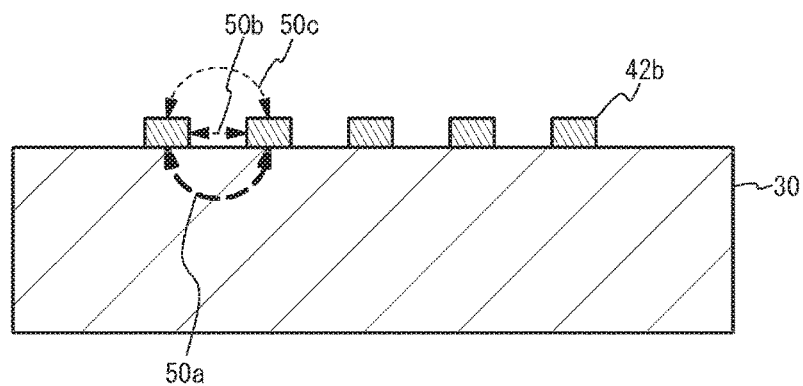
FIG. 17A and FIG. 17B are cross-sectional views of the capacitors in the first embodiment and a seventh variation of the first embodiment, respectively.
Figure 17B:
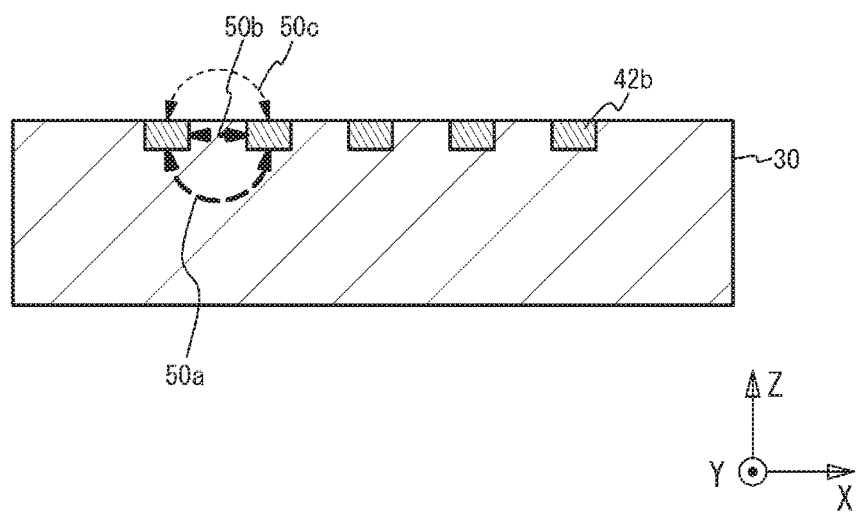

FIG. 17A and FIG. 17B are cross-sectional views of capacitors in the first embodiment and a seventh variation of the first embodiment, respectively. As illustrated in FIG. 17A, in the first embodiment, the electrode fingers 42b of the electrode 42 are formed on the piezoelectric substrate 30. In this structure, an electric line of force 50a between the lower surfaces of the electrode fingers 42b passes through the inside of the piezoelectric substrate 30. An electric line of force 50b between the side surfaces of the electrode fingers 42b and an electric line of force 50c between the upper surfaces of the electrode fingers 42b pass through the air or the temperature compensation film.

As illustrated in FIG. 17B, in the seventh variation of the first embodiment, the electrode fingers 42b are embedded in the piezoelectric substrate 30. The upper surface of the electrode finger 42b is exposed from the piezoelectric substrate 30. In this structure, the electric line of force 50b between the side surfaces of the electrode fingers 42b passes through the inside of the piezoelectric substrate 30. Other structures are the same as those of the first embodiment, and the description thereof is thus omitted. In the seventh variation of the first embodiment, the number of electric lines of force passing through the inside of the piezoelectric substrate 30, which has a large relative permittivity, increases. Thus, the electrostatic capacitance between the electrode fingers 42b increases. Therefore, the area of the capacitor Cn is reduced.

Eighth Variation of First Embodiment

Figure 18:
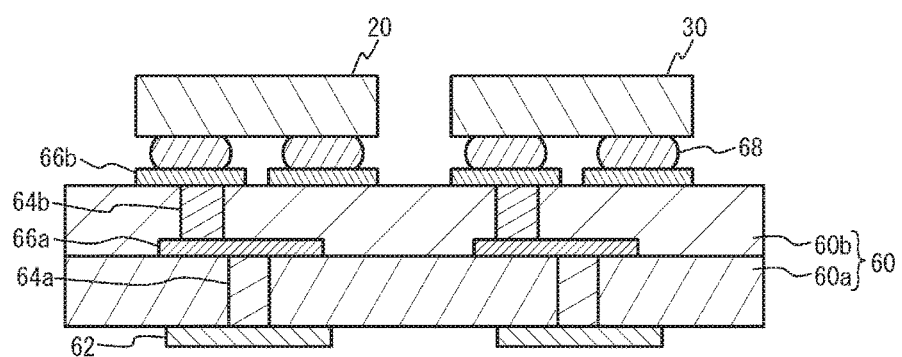
FIG. 18 is a cross-sectional view of a duplexer in an eighth variation of the first embodiment.

Eighth through tenth variations of the first embodiment will describe tangible examples of the inductor Ln. FIG. 18 is a cross-sectional view of a duplexer in the eighth variation of the first embodiment. As illustrated in FIG. 18, the substrate 20 and the piezoelectric substrate 30 are flip-chip mounted on a mounting substrate 60. The mounting substrate 60 includes insulating layers 60a and 60b that are stacked. Conductor patterns 62 are located on the lower surface of the insulating layer 60a. Conductor patterns 66a and 66b are located on the upper surfaces of the insulating layers 60a and 60b, respectively. Via wirings 64a and 64b respectively penetrate through the insulating layers 60a and 60b. The via wiring 64a electrically connects the conductor patterns 62 and 66a. The via wiring 64b electrically connects the conductor patterns 66a and 66b. The conductor pattern 66b is electrically connected to the substrate 20 and the piezoelectric substrate 30 through bumps 68. The insulating layers 60a and 60b are, for example, resin plates or ceramic plates. The conductor patterns 62, 66a, and 66b and the via wirings 64a and 64b are formed of a metal layer such as, for example, a Cu layer, an Al layer, or an Au layer. The bumps 68 are, for example, Au bumps, solder bumps, or Cu bumps.

Figure 19A:
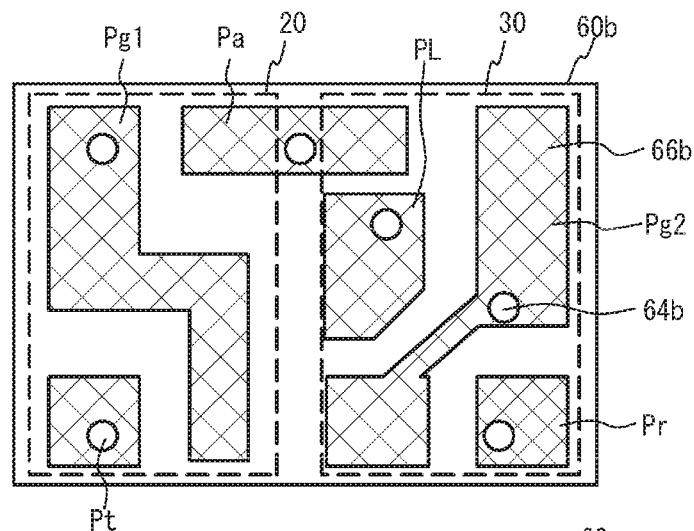
FIG. 19A through FIG. 19C are plan views of insulating layers in the eighth variation of the first embodiment.
Figure 19B:
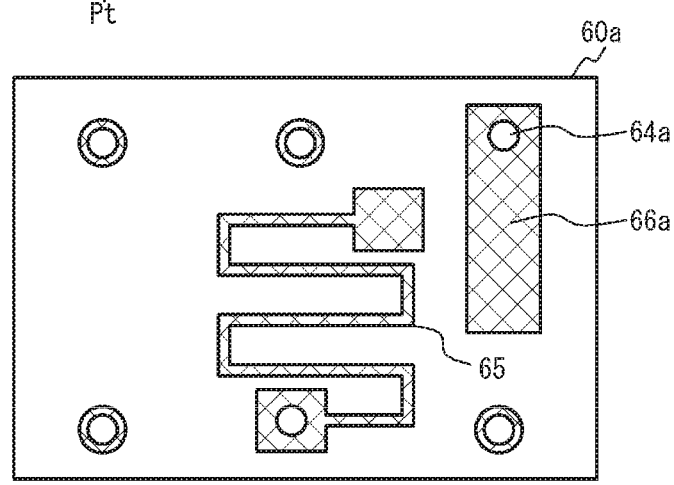
Figure 19C:
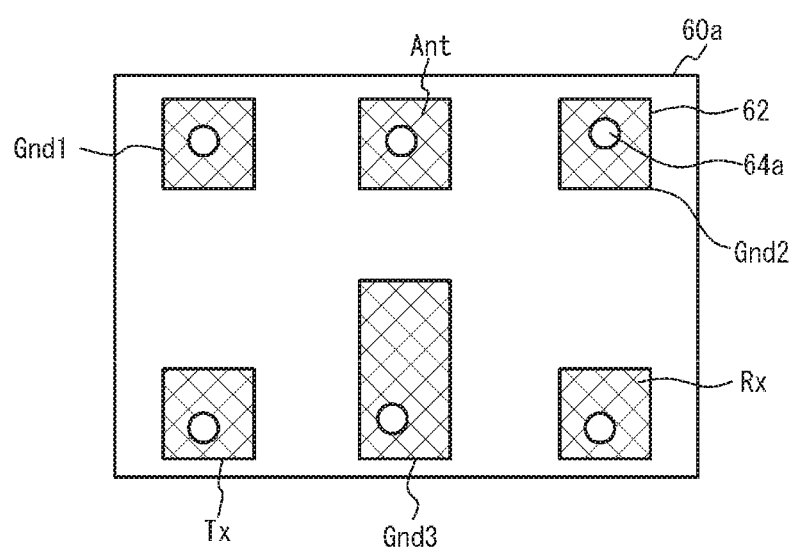

FIG. 19A through FIG. 19C are plan views of insulating layers in the eighth variation of the first embodiment. FIG. 19A is a plan view of the upper surface of the insulating layer 60b. The substrate 20 and the piezoelectric substrate 30 are indicated by dashed lines. FIG. 19B is a plan view of the upper surface of the insulating layer 60a. FIG. 19C is a plan view of the lower surface of the insulating layer 60a, and transparently illustrates the insulating layer 60a.

As illustrated in FIG. 19A, the conductor patterns 66b include a common pad Pa, a transmit pad Pt, a receive pad Pr, an inductor connection pad PL, and ground pads Pg1 and Pg2. The common pad Pa is electrically coupled to the common pads Pant of the substrate 20 and the piezoelectric substrate 30 via the bumps 68. The transmit pad Pt and the ground pad Pg1 are electrically coupled to the transmit pad Ptx and the ground pad Pgnd (see FIG. 4A) of the substrate 20 via the bumps 68, respectively. The receive pad Pr, the inductor connection pad P1, and the ground pad Pg2 are electrically coupled to the receive pad Prx, the inductor connection pad PL, and the ground pad Pgnd of the piezoelectric substrate 30 via the bumps 68, respectively.

As illustrated in FIG. 19B, the conductor patterns 66a include an inductor pattern 65. A first end of the inductor pattern 65 is electrically coupled to the inductor connection pad PL through the via wiring 64b (see FIG. 19A).

As illustrated in FIG. 19C, the conductor patterns 62 include the common terminal Ant for connecting with an external circuit, the transmit terminal Tx, the receive terminal Rx, and ground terminals Gnd1 through Gnd3. The common terminal Ant, the transmit terminal Tx, the receive terminal Rx, and the ground terminals Gnd1 and Gnd2 are electrically coupled to the common pad Pa, the transmit pad Pt, the receive pad Pr, and the ground pads Pg1 and Pg2 through the via wiring 64a, the conductor pattern 66a, and the via wiring 64b, respectively. The ground terminal Gnd3 is electrically coupled to a second end of the inductor pattern 65 through the via wiring 64a. This structure connects the inductor pattern 65, which forms the inductor Ln, in series between the inductor connection pad P1 and a ground. The inductor pattern 65 is of a meander type. Other structures are the same as those of the first embodiment, and the description thereof is thus omitted.

Ninth Variation of First Embodiment

Figure 20:
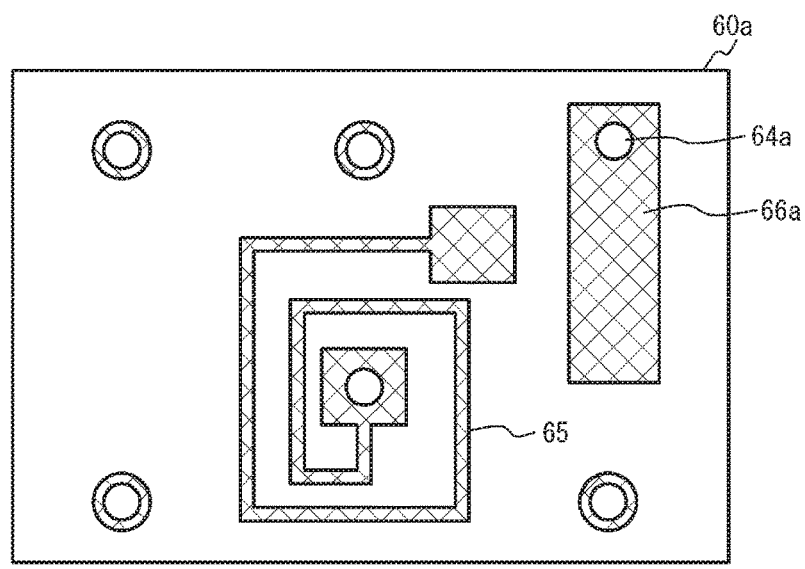
FIG. 20 is a plan view of an insulating layer in a ninth variation of the first embodiment.

FIG. 20 is a plan view of an insulating layer in a ninth variation of the first embodiment. As illustrated in FIG. 20, the inductor pattern 65 formed of the conductor pattern 66a is located on the upper surface of the insulating layer 60a. The inductor pattern 65 is of a spiral type. Other structures are the same as those of the eighth variation of the first embodiment, and the description thereof is thus omitted.

Tenth Variation of First Embodiment

Figure 21:
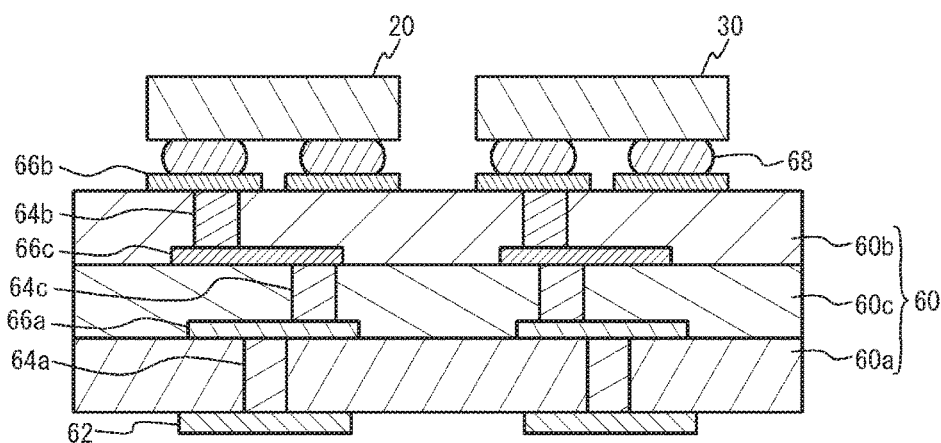
FIG. 21 is a cross-sectional view of a duplexer in a tenth variation of the first embodiment.

FIG. 21 is a cross-sectional view of a duplexer in a tenth variation of the first embodiment. As illustrated in FIG. 21, an insulating layer 60c is located between the insulating layers 60a and 60b. Conductor patterns 66c are located on the upper surface of the insulating layer 60c. Via wirings 64c penetrate through the insulating layer 60c.

Figure 22A:
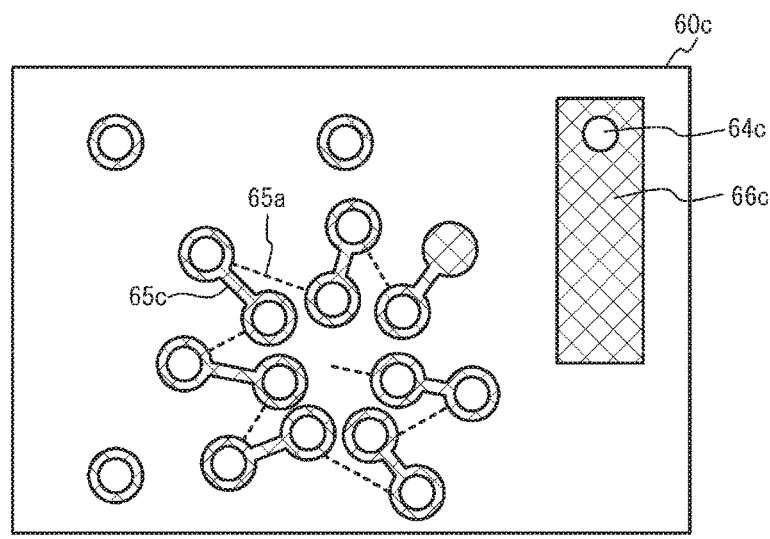
FIG. 22A and FIG. 22B are plan views of insulating layers in the tenth variation of the first embodiment.
Figure 22B:
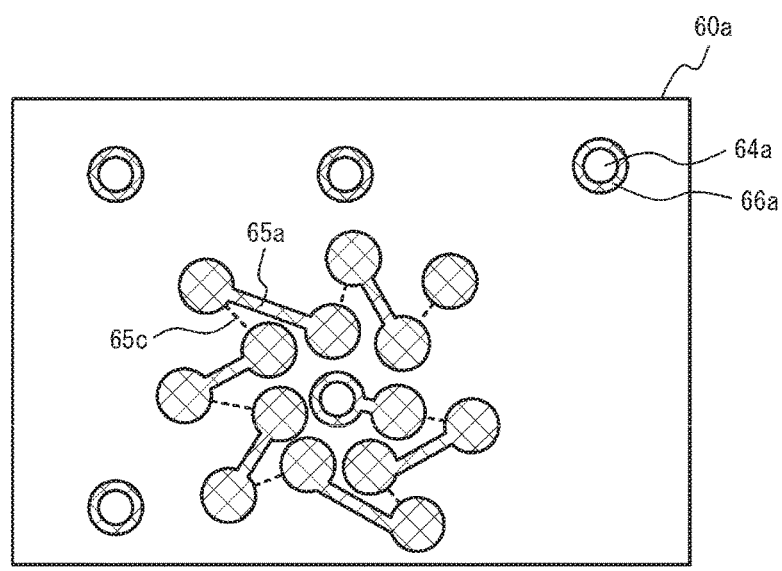

FIG. 22A and FIG. 22B are plan views of the insulating layers in the tenth variation of the first embodiment. FIG. 22A is a plan view of the upper surface of the insulating layer 60c. FIG. 22B is a plan view of the upper surface of the insulating layer 60a. As illustrated in FIG. 22A, linear inductor patterns 65c formed of the conductor patterns 66c are located on the upper surface of the insulating layer 60c. As illustrated in FIG. 22B, linear inductor patterns 65a formed of the conductor patterns 66a are located on the upper surface of the insulating layer 60a. FIG. 22A and FIG. 22B indicate the inductor patterns 65a and 65c by dashed lines. A plurality of the inductor patterns 65c and 65a are coupled to each other through the via wirings 64c to form a helical type. First ends of the inductor patterns 65c and 65a connected in a helical manner are electrically coupled to the inductor connection pad PL through the via wirings 64b. Second ends of the inductor patterns 65c and 65a are electrically coupled to the ground terminal Gnd3 through the via wirings 64a. This structure connects the inductor patterns 65c and 65a, which constitute the inductor Ln, in series between the inductor connection pad P1 and a ground. Other structures are the same as those of the eighth variation of the first embodiment, and the description thereof is thus omitted.

As described in the eighth through tenth variations of the first embodiment, at least a part of the inductor Ln is formed on the mounting substrate 60 on which the substrate 20 and the piezoelectric substrate 30 are to be mounted. This structure reduces the duplexer size compared to the structure using a chip inductor. In addition, the variation in inductance is reduced. At least a part of the inductor Ln may be located on the substrate 20 or the piezoelectric substrate 30.

In the first embodiment and the variations thereof, the transmit filter 10 (a first filter) includes the piezoelectric thin film resonator 21 located on the substrate 20. The receive filter 12 (a second filter) includes an acoustic wave resonator including an IDT located on the piezoelectric substrate 30. The capacitor Cn coupled to the transmit filter 10 includes a pair of electrodes that face each other in the planar direction and are located on the piezoelectric substrate 30.

Since the capacitor Cn located on the piezoelectric substrate 30 is used, the duplexer size is reduced compared to a structure using a chip capacitor. In addition, the electrodes facing each other in the planar direction are precisely formed. Thus, the tolerance is small, and the variation in capacitance is reduced. In addition, the second harmonic is reduced compared to a structure in which the capacitor Cn is located on the substrate 20 and the piezoelectric film 23 is used for the dielectric of an MIM capacitor. The number of fabrication steps is reduced compared to a structure in which the capacitor Cn is located on the substrate 20 and the dielectric film of the MIM capacitor is newly formed. The distance between the electrodes is broaden compared to a structure in which a resonator located on the piezoelectric substrate 30 is used as a notch circuit. Since the piezoelectric substrate 30 having a large relative permittivity is used, the capacitor Cn is reduced in size.

As described in the first through fifth variations of the first embodiment, the pair of electrodes 42 is a pair of comb-shaped electrodes 42 (i.e., comb-shaped electrodes). This structure reduces the area of the capacitor Cn.

Furthermore, as described in the first through fourth variations of the first embodiment, the arrangement direction of the electrode fingers 32b of the IDT 32 intersects with the arrangement direction of the electrode fingers 42b of the pair of electrodes 42. This structure reduces the interference between the IDT 32 and the pair of electrodes 42.

Furthermore, as described in the first through fifth variations of the first embodiment, the pitch of the electrode fingers 32b of the IDT 32 differs from the pitch of the electrode fingers 42b of the pair of electrodes 42. This structure reduces the interference between the IDT 32 and the pair of electrodes 42. To increase the processing accuracy of the electrode fingers 42b, the pitch of the electrode fingers 42b is preferably greater than the pitch of the electrode fingers 32b.

Furthermore, as described in the seventh variation of the first embodiment, the pair of electrodes 42 is embedded in the piezoelectric substrate 30. This structure reduces the size of the capacitor Cn.

Furthermore, the transmit filter 10 and the receive filter 12 support the same communication method (for example, the same band). In a duplexer including the transmit filter 10 and the receive filter 12, the second harmonic from the transmit filter 10 becomes a problem because large electric power is applied to the transmit filter 10. On the other hand, a piezoelectric thin film resonator is used for the transmit filter 10 to increase the power durability. Thus, the notch circuit 14 coupled to the transmit filter 10 is preferably used for the piezoelectric substrate 30. The first filter may be a receive filter, and the second filter may be a transmit filter. Both the first filter and the second filter may be transmit filters or receive filters.

As described in the first embodiment and the first variation thereof, in the notch circuit 14, the capacitor Cn is connected in series between the output terminal of the transmit filter 10 and a ground. The inductor Ln is connected in series with the capacitor Cn between the output terminal of the transmit filter 10 and a ground. The second harmonic is output to the output terminal of the transmit filter 10. Thus, the notch circuit 14 is preferably connected between the output terminal of the transmit filter 10 and a ground.

As described in the second variation of the first embodiment, the capacitor Cn and the inductor Ln are connected in parallel between the node N1, to which the transmit filter 10 and the receive filter 12 are commonly coupled, and the common terminal Ant. This structure inhibits the second harmonic from being output from the common terminal Ant.

As described in the first embodiment and the first and second variations thereof, the notch circuit 14 preferably has a suppression band within the frequency band that is twice the passband of the transmit filter 10. This structure reduces the second harmonic generated by the transmit filter 10. The suppression band of the notch circuit 14 may be an arbitrary frequency. This structure reduces unnecessary signals with the arbitrary frequency. The capacitor Cn may not be necessarily the capacitor of the notch circuit 14.

Second Embodiment

Figure 23:
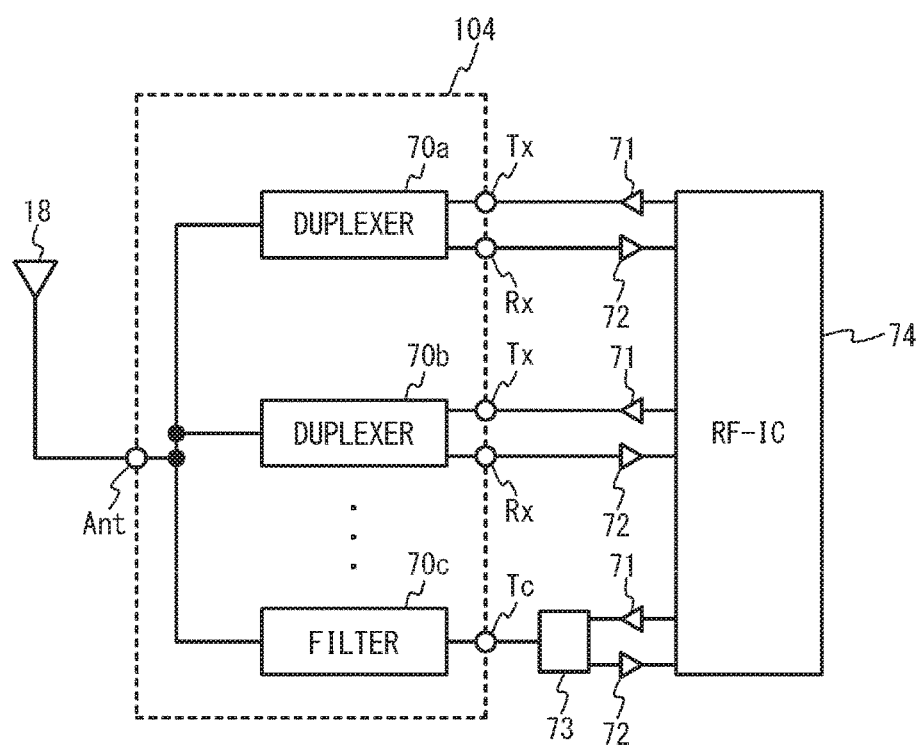
FIG. 23 is a block diagram of a multiplexer in accordance with a second embodiment.

A second embodiment is an exemplary multiplexer including three or more filters. FIG. 23 is a block diagram of a multiplexer in accordance with the second embodiment. As illustrated in FIG. 23, the multiplexer 104 includes a plurality of duplexers 70a and 70b and a filter 70c. The common terminals of the duplexers 70a and 70b are coupled to the common terminal Ant. A first end of the filter 70c is coupled to the common terminal Ant, and a second end is coupled to a terminal Tc. The duplexer 70a includes a transmit filter and a receive filter supporting the same communication method (for example, a band). The duplexer 70b includes a transmit filter and a receive filter supporting the same communication method (for example, a band).

The duplexers 70a and 70b are duplexers supporting the Frequency Division Duplex (FDD) method. In the FDD method, since the transmission and the reception are divided by frequency, the transmit band and the receive band do not overlap in the band of the FDD method. Thus, each of the duplexers 70a and 70b includes a transmit filter and a receive filter of which the passbands do not overlap. The filter 70c is a filter supporting the Time Division Duplex (TDD) method. In the TDD method, since the transmission and the reception are divided by time, the transmit band and the receive band overlap in the band of the TDD method. Thus, the filter 70c functions as both the transmit filter and the receive filter.

A Radio Frequency (RF)-Integrated Circuit (IC) 74 outputs transmission signals to a power amplifier (PA) 71. The PA 71 amplifies transmission signals, and outputs amplified transmission signals to the transmit terminal Tx. A low noise amplifier (LNA) 72 amplifies a reception signal output from the receive terminal Rx of the multiplexer 104, and outputs the amplified reception signal to the RF-IC 74. A switch 73 couples the terminal Tc to one of the PA 71 and the LNA 72. When the switch 73 couples the terminal Tc to the PA 71, the filter 70c functions as a transmit filter. When the switch 73 couples the terminal Tc to the LNA 72, the filter 70c functions as a receive filter.

One of the transmit filters and the receive filters of the duplexers 70a and 70b and the filter 70c is the first filter including a piezoelectric thin film resonator. The remaining filters of the transmit filters and the receive filters of the duplexers 70a and 70b and the filter 70c are the second filters of which the capacitors Cn are formed on the same piezoelectric substrate. The first filter and the second filter may be a transmit filter and a receive filter for the same band. The first filter and the second filter may be filters for different bands.

First Variation of Second Embodiment

Figure 24:
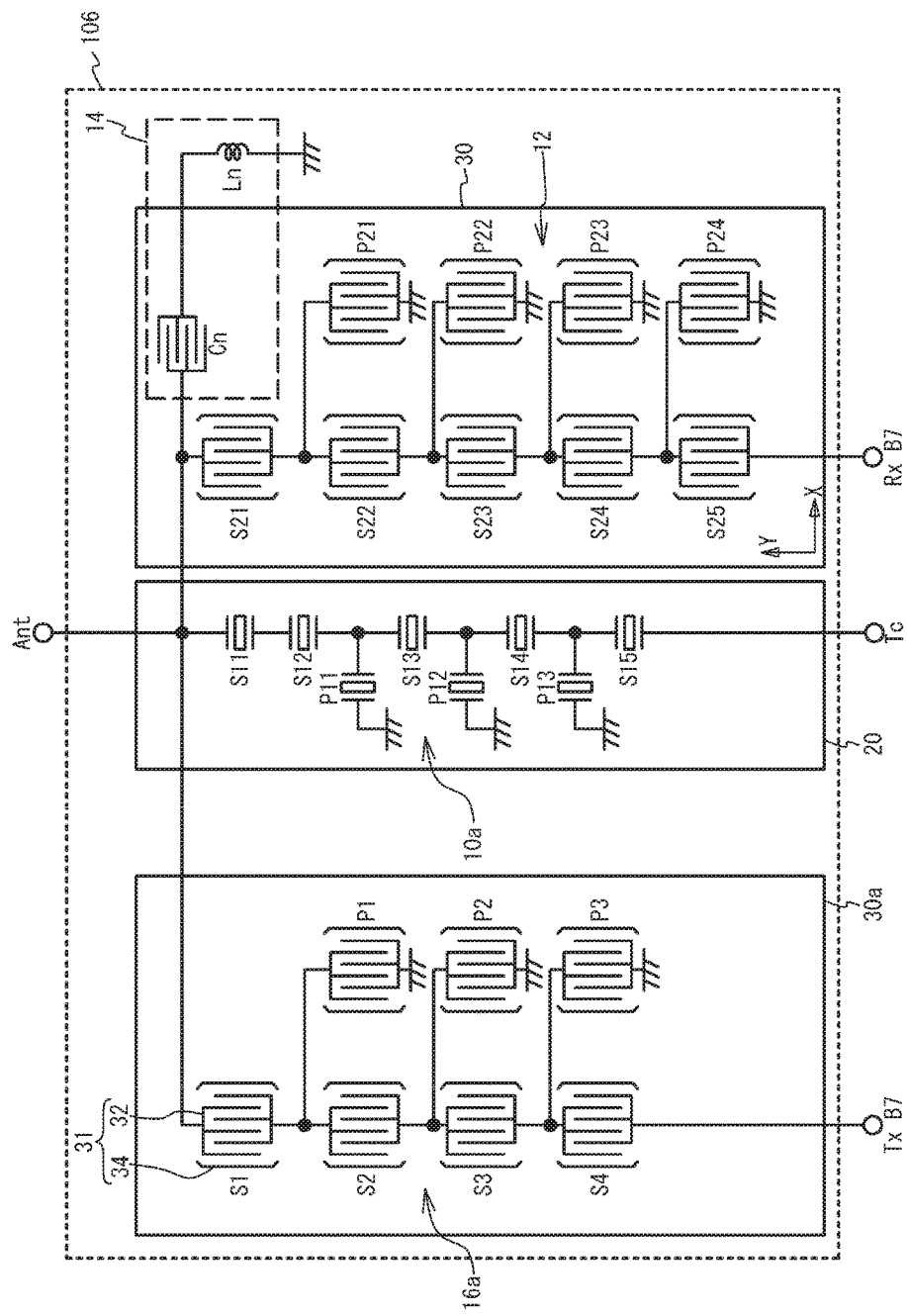
FIG. 24 is a circuit diagram of a multiplexer in accordance with a first variation of the second embodiment.

FIG. 24 is a circuit diagram of a multiplexer in accordance with a first variation of the second embodiment. As illustrated in FIG. 24, a multiplexer 106 includes a transmit filter 16a, the receive filter 12, a filter 10a, and the notch circuit 14. The transmit filter 16a is a transmit filter for Band7 of the FDD method, and is connected between the common terminal Ant and a transmit terminal TxB7. The receive filter 12 is a receive filter for Band7, and is connected between the common terminal Ant and a receive terminal RxB7. The filter 10a is a filter for Band40 (communication band: 2496 MHz to 2690 MHz) of the TDD method, and is connected between the common terminal Ant and the terminal Tc.

The transmit filter 16a includes series resonators S1 through S4 and parallel resonators P1 through P3 that are surface acoustic wave resonators located on a piezoelectric substrate 30a. The receive filter 12 includes the series resonators S21 through S25 and the parallel resonators P21 through P24 that are surface acoustic wave resonators located on the piezoelectric substrate 30. The filter 10a includes the series resonators S11 through S15 and the parallel resonators P11 through P13 that are piezoelectric thin film resonators located on the substrate 20. The capacitor Cn is located on the piezoelectric substrate 30. Other structures are the same as those of the first embodiment, and the description thereof is thus omitted.

As described in the first variation of the second embodiment, the first filter including a piezoelectric thin film resonator may be a filter supporting the TDD method, and the second filter located on the single piezoelectric substrate 30 on which the capacitor Cn is also located may be a filter supporting the FDD method.

Second Variation of Second Embodiment

Figure 25:
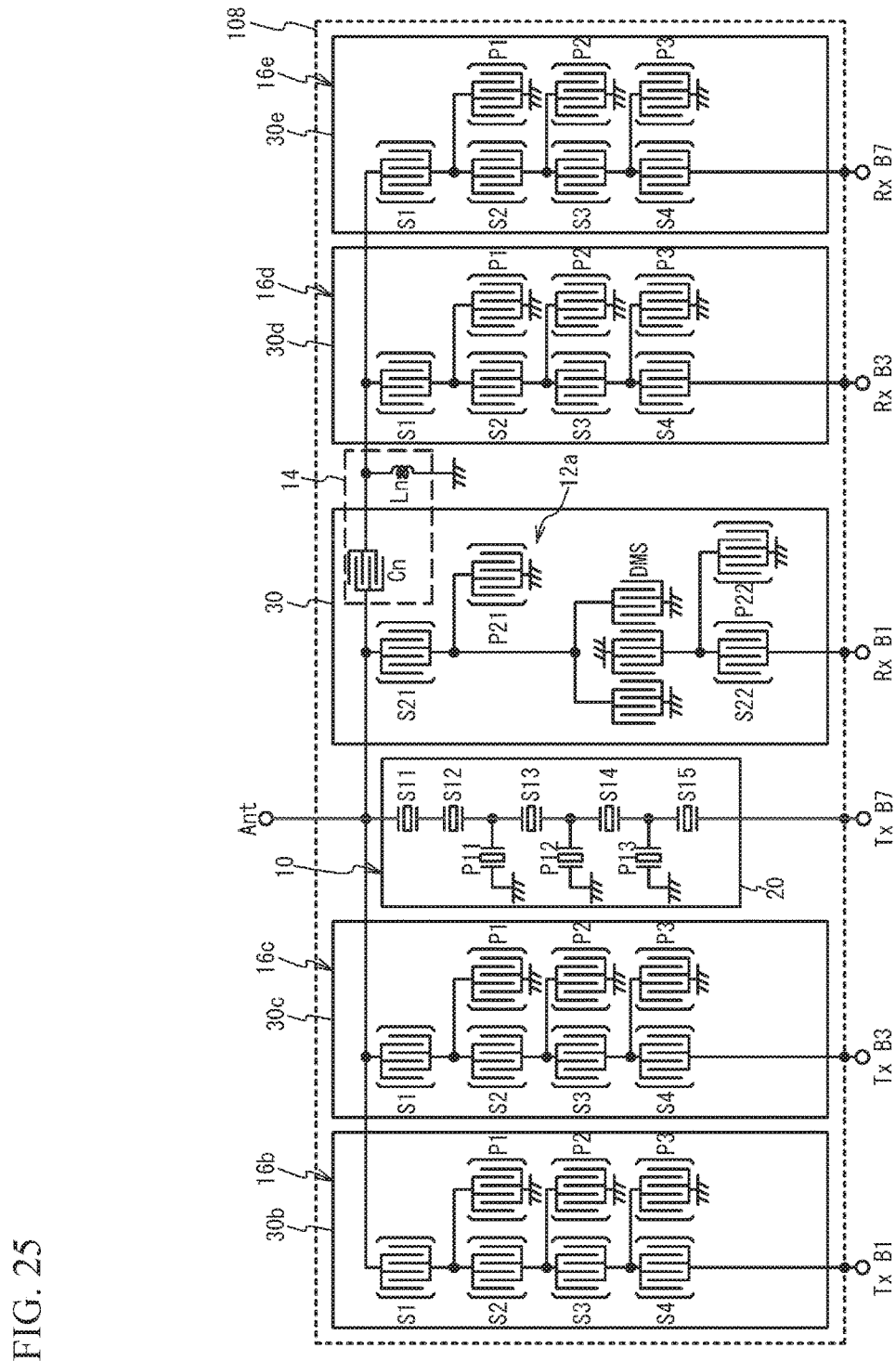
FIG. 25 is a circuit diagram of a multiplexer in accordance with a second variation of the second embodiment.

FIG. 25 is a circuit diagram of a multiplexer in accordance with a second variation of the second embodiment. As illustrated in FIG. 25, a multiplexer 108 includes transmit filters 16b, 16c, and 10, and receive filters 12a, 16d, and 16e. The transmit filter 16b is for Band1 (transmit band: 1920 MHz to 1980 MHz) of the FDD method, and is connected between the common terminal Ant and a transmit terminal TxB1. The transmit filter 16c is for Band3 (transmit band: 1710 MHz to 1785 MHz) of the FDD method, and is connected between the common terminal Ant and a transmit terminal TxB3. The transmit filter 10 is for Band7, and is connected between the common terminal Ant and the transmit terminal TxB7. The receive filter 12a is for Band1 (receive band: 2110 MHz to 2170 MHz), and is connected between the common terminal Ant and a receive terminal RxB1. The receive filter 16d is for Band3 (receive band: 1805 MHz to 1880 MHz), and is connected between the common terminal Ant and a receive terminal RxB3. The receive filter 16e is for Band7, and is connected between the common terminal Ant and the receive terminal RxB7.

Each of the transmit filters 16b and 16c and the receive filters 16d and 16e include the series resonators S1 through S4 and the parallel resonators P1 through P3 that are surface acoustic wave resonators located on the corresponding one of piezoelectric substrates 30b through 30e. The transmit filter 10 includes the series resonators S11 through S15 and the parallel resonators P11 through P13 that are piezoelectric thin film resonators located on the substrate 20. The receive filter 12a includes the series resonators S21 and S22 and the parallel resonators P21 and P22, which are surface acoustic wave resonators, and a multimode filter DMS located on the piezoelectric substrate 30. The capacitor Cn is located on the piezoelectric substrate 30. Other structures are the same as those of the first embodiment, and the description thereof is thus omitted.

As described in the first variation of the second embodiment, the first filter including a piezoelectric thin film resonator may be a filter supporting the FDD method, and the second filter located on the single piezoelectric substrate 30 on which the capacitor Cn is also located may be a filter supporting the FDD method and an LTE band different from that of the first filter.

As described in the first and second variations of the second embodiment, the communication methods of the first filter and the second filter may be different. When the communication methods are different, division multiplex methods may be different as described in the first variation of the second embodiment, or LTE bands may be different in the same division multiplex method as described in the second variation of the second embodiment. The number of filters included in the multiplexer may be freely selected. In addition the communication method (for example, the division multiplex method and the band) of each filter may be freely selected.

Although the embodiments of the present invention have been described in detail, it is to be understood that the various change, substitutions, and alterations could be made hereto without departing from the spirit and scope of the invention.

What is claimed is:

1. A multiplexer comprising:
    a first filter that includes a piezoelectric thin film resonator and is connected between a common terminal and a first terminal, the piezoelectric thin film resonator being located on a substrate;
    a second filter that includes an acoustic wave resonator and is connected between the common terminal and a second terminal, the acoustic wave resonator including an IDT located on a single piezoelectric substrate;
    a capacitor that includes a pair of electrodes facing each other in a planar direction and is coupled to the first filter, the pair of electrodes being located on the single piezoelectric substrate;
    a notch circuit including the capacitor and an inductor connected in series with the capacitor between a node between the first filter and the second filter and a ground and having a resonant frequency of a series resonant circuit formed by the capacitor and the inductor within a frequency band that is twice a passband of the first filter,
    wherein the piezoelectric thin film resonator includes a piezoelectric film located on the substrate, and a lower electrode and an upper electrode sandwiches the piezoelectric film.

2. The multiplexer according to claim 1, wherein the pair of electrodes is a pair of comb-shaped electrodes.

3. The multiplexer according to claim 2, wherein
    an arrangement direction of electrode fingers of the IDT intersects with an arrangement direction of electrode fingers of the pair of comb-shaped electrodes.

4. The multiplexer according to claim 2, wherein a pitch of electrode fingers of the IDT differs from a pitch of electrode fingers of the pair of comb-shaped electrodes.

5. The multiplexer according to claim 1, wherein the pair of electrodes is embedded in the single piezoelectric substrate.

6. The multiplexer according to claim 1, wherein
    the first filter is one of a transmit filter and a receive filter that support a same communication method, and
    the second filter is another one of the transmit filter and the receive filter.

7. The multiplexer according to claim 1, wherein the pair of electrodes are formed of an identical metal layer with the IDT.

8. A multiplexer comprising:
    a first filter that includes a piezoelectric thin film resonator and is connected between a common terminal and a first terminal, the piezoelectric thin film resonator being located on a substrate;

a second filter that includes an acoustic wave resonator and is connected between the common terminal and a second terminal, the acoustic wave resonator including an IDT located on a piezoelectric substrate; and a capacitor that includes a pair of electrodes facing each other in a planar direction and is coupled to the first filter, the pair of electrodes being located on the piezoelectric substrate, wherein the first filter and the second filter support different communication methods.

9. A multiplexer comprising:

a first filter that includes a piezoelectric thin film resonator and is connected between a common terminal and a first terminal, the piezoelectric thin film resonator being located on a substrate;

a second filter that includes an acoustic wave resonator and is connected between the common terminal and a second terminal, the acoustic wave resonator including an IDT located on a piezoelectric substrate;

a capacitor that includes a pair of electrodes facing each other in a planar direction and is coupled to the first filter, the pair of electrodes being located on the piezoelectric substrate; and a notch circuit including the capacitor and an inductor connected in parallel between a node, to which the first filter and the second filter are commonly coupled, and the common terminal.

10. The multiplexer according to claim 9, wherein the notch circuit has a suppression band within a frequency band that is twice a passband of the first filter.

* * * * *